(12) United States Patent
Shin et al.

(10) Patent No.: US 12,262,612 B2
(45) Date of Patent: Mar. 25, 2025

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: Minjae Shin, Paju-si (KR); Insu Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 521 days.

(21) Appl. No.: 17/564,923

(22) Filed: Dec. 29, 2021

(65) Prior Publication Data

US 2022/0208952 A1 Jun. 30, 2022

(30) Foreign Application Priority Data

Dec. 31, 2020 (KR) .......................... 10-2020-0189783

(51) Int. Cl.
*H10K 59/35* (2023.01)
*H10K 59/18* (2023.01)

(52) U.S. Cl.
CPC .................................. *H10K 59/18* (2023.02)

(58) Field of Classification Search
CPC ........ H10K 59/124; H10K 59/351–353; G02F 1/13336
See application file for complete search history.

(56) References Cited

U.S. PATENT DOCUMENTS

| | | | |
|---|---|---|---|
| 2004/0256620 A1 | 12/2004 | Yamazaki et al. | |
| 2017/0125506 A1* | 5/2017 | Kim | G09G 3/3225 |
| 2017/0248810 A1 | 8/2017 | Shibano et al. | |
| 2018/0188579 A1 | 7/2018 | Jeong et al. | |
| 2019/0123125 A1* | 4/2019 | Seki | H10K 50/8426 |
| 2019/0363267 A1* | 11/2019 | Tanaka | H05B 33/02 |
| 2020/0052054 A1 | 2/2020 | Park et al. | |
| 2020/0083306 A1* | 3/2020 | Choi | H10K 59/124 |
| 2020/0220098 A1* | 7/2020 | Tsai | H10K 71/18 |
| 2020/0313102 A1 | 10/2020 | Kim et al. | |
| 2020/0365674 A1 | 11/2020 | Jeon et al. | |
| 2021/0043713 A1* | 2/2021 | Sun | H10K 77/111 |
| 2021/0175464 A1* | 6/2021 | Wang | H10K 59/12 |
| 2022/0093036 A1* | 3/2022 | Im | H01L 23/49838 |

FOREIGN PATENT DOCUMENTS

| | | |
|---|---|---|
| EP | 3343273 A2 | 7/2018 |
| EP | 3648170 A1 | 5/2020 |
| KR | 10-2016-0093179 A | 8/2016 |
| KR | 10-2017-0054654 A | 5/2017 |
| KR | 10-2018-0002099 A | 1/2018 |
| WO | 2017/074103 A1 | 5/2017 |
| WO | 2020/004789 A1 | 1/2020 |

* cited by examiner

*Primary Examiner* — Eric K Ashbahian
(74) *Attorney, Agent, or Firm* — Seed IP Law Group LLP

(57) ABSTRACT

A light emitting display apparatus includes a plurality of pixels arranged along a first direction and a second direction different from the first direction over a first substrate, a circuit layer including a pixel common voltage line in parallel with the second direction and disposed between the plurality of pixels along the first direction, a light emitting device layer including a self-emitting device disposed over the circuit layer and a common electrode disposed over the self-emitting device, a common electrode connection portion electrically coupling the pixel common voltage line to the common electrode, and an inner isolation portion surrounding the common electrode connection portion and isolating the self-emitting device disposed over the inner isolation portion.

21 Claims, 10 Drawing Sheets

LIGHT EMITTING DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0189783 filed on Dec. 31, 2020, which is hereby incorporated by reference as if fully set forth herein.

BACKGROUND

Technical Field

The present disclosure relates to a light emitting display apparatus and a multi-screen display apparatus including the same.

Description of the Related Art

Light emitting display apparatuses which are self-emitting light emitting display apparatuses, do not need a separate light source unlike liquid crystal display (LCD) apparatuses, and thus, they may be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation light emitting display apparatuses.

Light emitting display apparatuses display an image based on the light emission of a light emitting device layer including a light emitting device interposed between two electrodes. In this case, light emitted by the light emitting device is discharged to the outside through an electrode and a substrate.

Light emitting display apparatuses include a display panel which is implemented to display an image. The display panel may include a display area which includes a plurality of pixels for displaying an image, an encapsulation layer which includes an organic encapsulation layer disposed in the display area, a dam which prevents the spread of the encapsulation layer, and a bezel area which surrounds the display area.

A light emitting display apparatus of the related art may need a bezel (or a mechanism) for occluding a bezel area disposed at an edge (or a periphery portion) of a display panel, and due to a width of the bezel, a bezel width may increase. Also, in a case where the bezel width of the light emitting display apparatus is largely reduced, the reliability of the display panel may decrease due to a degradation in a light emitting device caused by the penetration of water, and due to the non-filling or overflow of an organic encapsulation layer, the reliability of the display panel may be reduced.

Recently, multi-screen light emitting display apparatuses have been commercialized where a large screen is implemented by arranging the light emitting display apparatuses as a lattice type.

However, in a multi-screen light emitting display apparatus of the related art, a boundary portion such as a seam is formed between adjacent light emitting display apparatuses due to a bezel area or a bezel of each of a plurality of light emitting display apparatuses. The boundary portion may cause a sense of disconnection (or discontinuity) of an image when one image is being displayed on a total screen of the multi-screen light emitting display apparatus, and due to this, the immersion of a viewer watching the image may be reduced.

BRIEF SUMMARY

Accordingly, the present disclosure is directed to providing a light emitting display apparatus and a multi-screen display apparatus including the same that substantially obviate one or more problems due to limitations and disadvantages of the related art.

An aspect of the present disclosure is directed to providing a light emitting display apparatus and a multi-screen display apparatus including the same, which minimize a reduction in reliability of a light emitting display panel caused by the penetration of water and have a zero bezel width.

Another aspect of the present disclosure is directed to providing a light emitting display apparatus and a multi-screen display apparatus including the same, which minimize a reduction in reliability of a light emitting display panel caused by the penetration of water through a connection portion between a common electrode and a pixel common voltage line and have a zero bezel width.

Additional advantages and features of the disclosure will be set forth in part in the description which follows and in part will become apparent to those having ordinary skill in the art upon examination of the following or may be learned from practice of the disclosure.

The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a light emitting display apparatus comprises a plurality of pixels arranged along a first direction and a second direction different from the first direction over a first substrate, a circuit layer including a pixel common voltage line in parallel with the second direction and disposed between the plurality of pixels along the first direction, a light emitting device layer including a self-emitting device disposed over the circuit layer of the display portion and a common electrode disposed over the self-emitting device, a common electrode connection portion electrically coupling the pixel common voltage line to the common electrode, and an inner isolation portion surrounding the common electrode connection portion and isolating the self-emitting device disposed over the inner isolation portion In another aspect of the present disclosure, a multi-screen display apparatus comprises a plurality of display devices disposed along at least one direction of a first direction and a second direction different from the first direction, each of the plurality of display devices comprises a light emitting display apparatus, and the light emitting display apparatus comprises a plurality of pixels arranged along the first direction and the second direction over a substrate, a circuit layer including a pixel common voltage line in parallel with the second direction and disposed between the plurality of pixels along the first direction, a light emitting device layer including a self-emitting device disposed over the circuit layer and a common electrode disposed over the self-emitting device, a common electrode connection portion electrically coupling the pixel common voltage line to the common electrode, and an inner isolation portion surrounding the common electrode connection portion and isolating the self-emitting device disposed over the inner isolation portion.

Details of other exemplary embodiments will be included in the detailed description of the disclosure and the accompanying drawings.

An embodiment of the present disclosure may provide a light emitting display apparatus and a multi-screen display apparatus including the same, which minimize a reduction in reliability of a light emitting display panel caused by the penetration of water and have a zero bezel width.

An embodiment of the present disclosure may provide a light emitting display apparatus and a multi-screen display apparatus including the same, which minimize a reduction in reliability of a light emitting display panel caused by the penetration of water through a connection portion between a common electrode and a pixel common voltage line and have a zero bezel width.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
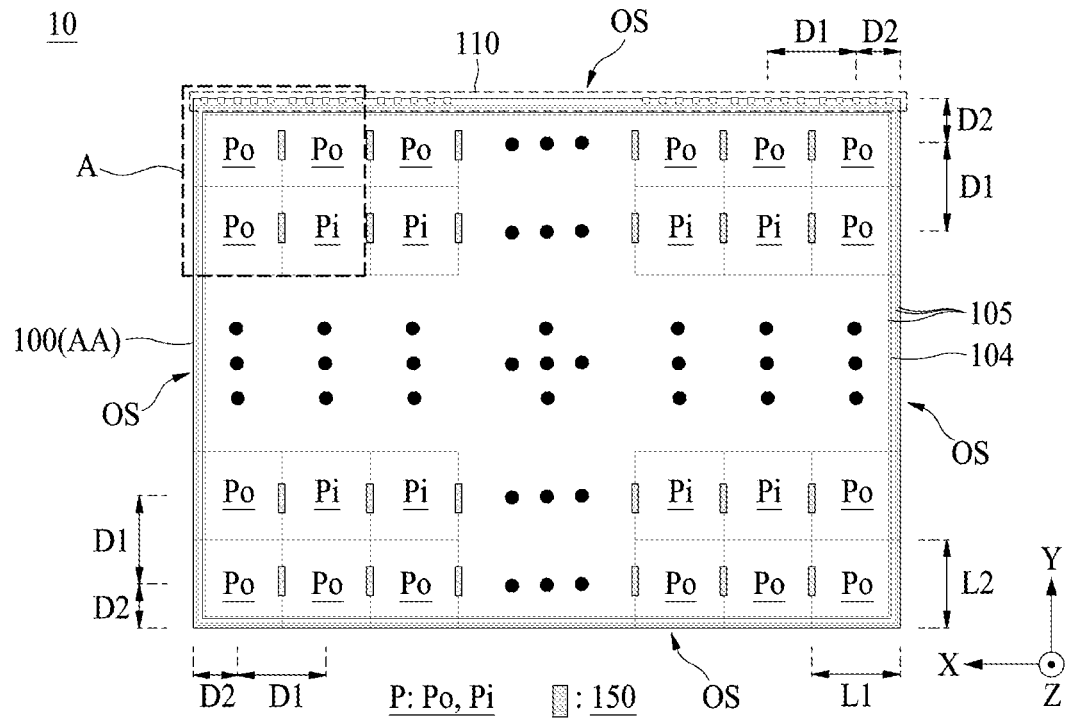
FIG. 1 is a plan view illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Same reference numerals refer to same elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam, this may be construed as the encapsulation layer at least partially surrounding the dam. However, in some embodiments, the encapsulation layer may entirely surround the dam. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a plan view illustrating a light emitting display apparatus according to an embodiment of the present disclosure.

Referring to FIG. 1, the light emitting display apparatus (or a display panel) 10 according to an embodiment of the present disclosure may include a substrate 100 including a display area AA, and a plurality of pixels P in the display area AA of the substrate 100.

The substrate 100 may be referred to as a first substrate, a base substrate, or a pixel array substrate. The substrate 100 may be a glass substrate, or may be a thin glass substrate or a plastic substrate, which is bendable or flexible.

The display area AA of the substrate 100 may be an area which displays an image and may be referred to as an active portion, an active area, a display portion, or a display screen. A size of the display area AA may be the same as or substantially the same as the substrate 100 (or the light emitting display apparatus or the display panel). For example, a size of the display area AA may be the same as a total size of the first surface of the substrate 100. The size can be considered in one embodiment an area that is defined in terms of the length and the width of a structure, such as the display area or the substrate area. Therefore, the display area AA may be implemented (or disposed) on the whole front surface of the substrate 100, and thus, the substrate 100 may not include an opaque non-display portion which is provided along a periphery portion (or an edge portion) of the first surface to surround all of the display area AA. Accordingly, a whole front surface of the light emitting display apparatus may implement the display area AA. In this embodiment, the display area and the substrate area are the same size and shape. Namely, they have the same width and length as each other.

An end portion (or an outermost portion) of the display area AA may overlap or may be substantially aligned with the outer surface OS of the substrate 100. For example, with respect to a thickness direction Z of the light emitting display apparatus, a lateral surface (or an end line) of the display area AA may be substantially aligned at a vertical extension line vertically extending from the outer surface OS of the substrate 100. The lateral surface of the display area AA may not be surrounded by a separate mechanism and may only be abutting ambient air. For example, all lateral surfaces of the display area AA may be provided in a structure which directly contacts air without being surrounded by a separate mechanism. Therefore, the outer surface OS of the substrate 100 corresponding to the end portion of the display area AA may be surrounded by only air (or abutting ambient air), and thus, the light emitting display apparatus according to an embodiment of the present disclosure may have an air-bezel structure or a non-bezel structure (or a zero bezel) where the end portion (or lateral surface) of the display area AA is surrounded by air there is no opaque non-display area surrounding the display AA.

The plurality of pixels P may be arranged (or disposed) at the display area AA of the substrate 100 to have the first interval D1 along a first direction X and a second direction Y. For example, the first direction X may be traverse to (or intersect or cross) the second direction Y. The first direction X may be a widthwise direction, a horizontal direction, or a first length direction (for example, a widthwise length direction) of the substrate 100 or the light emitting display apparatus. The second direction Y may be a lengthwise direction, a vertical direction, or a second length direction (for example, a lengthwise length direction) of the substrate 100 or the light emitting display apparatus.

Each of the plurality of pixels P may be implemented on a plurality of pixel areas defined on the display area AA of the substrate 100. Each of the plurality of pixels P may have a first length L1 parallel to the first direction X and a second length L2 parallel to the second direction Y. The first length L1 may be the same as the second length L2 or the first interval D1. The second length L2 can be referred to as a second width, a height, a lengthwise length, or a lengthwise width. The first length L1 and the second length L2 may be the same as the first interval D1. Therefore, the plurality of pixels (or pixel areas) P may all have the same size.

Two pixels P adjacent to each other along the first direction X and the second direction Y may have the same first interval D1 without an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P according to an embodiment may be include a circuit layer including a pixel circuit implemented in the pixel area on the substrate 100, and a light emitting device layer disposed at the circuit layer and coupled to the pixel circuit. The pixel circuit outputs a data current corresponding to the data signal in response to the data signal and the scan signal supplied from the pixel driving lines disposed in the pixel area. The light emitting device layer may include a self-emitting device that emits light by the data current supplied from the pixel circuit. The pixel driving lines, the pixel circuit, and the light emitting device layer will be described below.

The plurality of pixels P may be grouped (or classified) into outermost pixels Po and internal pixels (or inner pixels) Pi.

The outermost pixels Po may be pixels disposed closest to the outer surface OS of the substrate 100 among the plurality of pixels P.

A second interval D2 between a center portion of each of the outermost pixels Po and the outer surface OS of the substrate 100 may be half or less of the first interval D1. For example, the second interval D2 may be a distance (or a length) between a center portion of the outermost pixel Po and the outer surface OS of the substrate 100. For example, the second interval D2 may be a shortest distance (or a shortest length) between a center portion of the outermost pixel Po and the outer surface OS of the first substrate 100.

When the second interval D2 is greater than half of the first interval D1, the substrate 100 may have a greater size than the display area AA by a difference area between half of the first interval D1 and the second interval D2, and thus, an area between the end of the outermost pixel Po and the outer surface OS of the substrate 100 may be configured as a non-display area surrounding all of the display area AA. For example, when the second interval D2 is greater than half of the first interval D1, the substrate 100 may necessarily include a bezel area based on a non-display area surrounding all of the display area AA. On the other hand, when the second interval D2 is half or less of the first interval D1, the end of each of the outermost pixels Po may be aligned (or disposed) with the outer surface OS of the substrate 100, or the end portion of the display area AA may be aligned (or disposed) with the outer surface OS of the substrate 100, and thus, the display area AA may be implemented (or disposed) on the whole front surface of the substrate 100.

The internal pixels Pi may be pixels other than the outermost pixels Po among the plurality of pixels P, or may be pixels surrounding by the outermost pixels Po among the plurality of pixels P. The internal pixels (or second pixels) Pi may be implemented to have a configuration or a structure, which differs from the outermost pixels (or first pixels) Po.

The light emitting display apparatus (or a display panel) 10 according to an embodiment of the present disclosure may further include a pad part 110.

The pad part 110 may be a first pad part or a front pad part. The pad part 110 may include a plurality of pads to receive a data signal, a gate control signal, a pixel driving power, a reference voltage, and a pixel common voltage, or the like from the driving circuit part.

The pad part 110 may be included within an area that also includes the outermost pixels Po disposed at a first periphery portion of the first surface of the first substrate 100 parallel to the first direction X. Each of the pixels Po is therefore considered an outermost pixel since within their respective row and/or column of pixels, they are the outermost of the pixels. The outermost pixels Po disposed at the first periphery portion of the first substrate 100 may include at least one of the plurality of pads within their pixel area. Therefore, the plurality of pads may be disposed or included within the display area AA, and thus, a non-display area (or a bezel area) based on the pad part 110 may not be formed or may not be on the first substrate 100. Therefore, the outermost pixel (or first pixels) Po may include the pad part 110, and thus, may be implemented to have a configuration or a structure, which differs from the internal pixel (or second pixels) Pi which includes no the pad part 110.

According to one embodiment, when the pad part 110 is not provided within the outermost pixels Po and is disposed between the outermost pixels Po and the outer surface OS of the first substrate 100, the substrate 100 may include a non-display area (or a non-display portion) corresponding to an area where the pad part 110 is provided, and due to the non-display area, the second interval D2 between the outermost pixels Po and the outer surface OS of the substrate 100 may be greater than half of the first interval D1, all of the substrate 100 may not be implemented as the display area AA, and a separate bezel (or a separate structure) for covering the non-display area may be present. On the other hand, the pad part 110 according to at least one embodiment of the present disclosure may be disposed between the outermost pixels Po and the outer surface OS of the substrate 100 to be included within the outermost pixels Po, and thus, a non-display area (or a bezel area) based on the pad part 110 may not be formed or may not be between the outermost pixels Po and the outer surface OS of the substrate 100.

The light emitting display apparatus (or a display panel) 10 according to an embodiment of the present disclosure may further include a gate driving circuit 150 which is disposed in the display area AA.

The gate driving circuit 150 may be disposed in the display area AA to supply a scan signal (or a gate signal) to the pixels P disposed on the substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line.

The gate driving circuit 150 according to an embodiment may be implemented with a shift register including a plurality of stage circuit units. That is, the display apparatus according to an embodiment of the present disclosure may include a shift register which is disposed in the display area AA of the substrate 100 to supply the scan signal to the pixel P.

Each of the plurality of stage circuit units may include a plurality of branch circuits which are arranged spaced apart from one another in each horizontal line of the substrate 100 in a first direction X. Each of the plurality of branch circuits may include at least one thin film transistor (TFT) (or branch TFT) and may be disposed between two adjacent pixels of one or more pixels P (or a pixel area) in one horizontal line in the first direction X. Each of the plurality of stage circuit units may generate a scan signal through driving of the plurality of branch circuits based on a gate control signal supplied through gate control lines disposed spaced apart from one another between a plurality of pixels P in the display area AA and may supply the scan signal to pixels P arranged in a corresponding horizontal line.

The light emitting display apparatus (or a display panel) 10 according to an embodiment of the present disclosure may further include a dam 104.

The dam 104 may be implemented at a periphery portion of the substrate 100, or may be implemented at a periphery portion of each of outermost pixels Po disposed in the display area AA. For example, the dam 104 may be disposed to have a closed loop line shape (or a closed loop shape) between a center portion of each of the outermost pixels Po and an outer surface OS of the substrate 100. Therefore, the outermost pixel Po may include the dam 104, and thus, may be implemented in a structure or a configuration which differs from an inner pixel Pi including no dam 104. The dam 104 may prevent the spread or overflow of an organic encapsulation layer of an encapsulation layer disposed on a light emitting device layer at the periphery portion of each of the outermost pixels Po.

The light emitting display apparatus (or the display panel) 10 according to an embodiment of the present disclosure may further include an outer device isolation portion 105.

The outer device isolation portion 105 may be implemented at the periphery portion of the substrate 100, or may be implemented at the periphery portion of each of the outermost pixels Po disposed in the display area AA. For example, the outer device isolation portion 105 may be disposed adjacent to or near the dam 104. For example, the outer device isolation portion 105 may be disposed at a periphery portion of each of the outermost pixels Po to have a closed loop line shape (or a closed loop shape) which is surrounded by the dam 104 or surrounds the dam 104. Accordingly, the outermost pixel Po may include the outer device isolation portion 105, and thus, may be implemented in a structure or a configuration which differs from the inner pixel Pi including no the outer device isolation portion 105. In the following description, the outer device isolation portion 105 may be referred to as an outer isolation portion 105.

The outer isolation portion 105 according to an embodiment may isolate (or disconnect) the periphery portion of each of the outermost pixels Po or a light emitting device layer adjacent to or near the dam 104 to block a lateral water penetration path, thereby preventing or minimizing a reduction in reliability of the light emitting device layer caused by the lateral penetration of water (or moisture). For example, the outer isolation portion 105 may be referred to as the term such as an outer water penetration blocking portion, an outer water penetration prevention portion, or an outer eaves structure, or the like.

The outer isolation portion 105 according to an embodiment may include at least two isolation structures. For example, the outer isolation portion 105 may include first to third isolation structures which are arranged in parallel to have a closed loop line shape. Each of the at least two isolation structures according to an embodiment may include an eaves structure for isolating (or disconnecting) the light emitting device layer. For example, each of the at least two isolation structures may include an eaves structure which is implemented by an insulation layer and a metal pattern layer (or a metal layer) over the insulation layer.

According to an embodiment, some of the at least two isolation structures may be surrounded by the dam 104, and the other of the at least two isolation structures may surround the dam 104. For example, the dam 104 may be disposed between the at least two isolation structures.

Figure 2A:
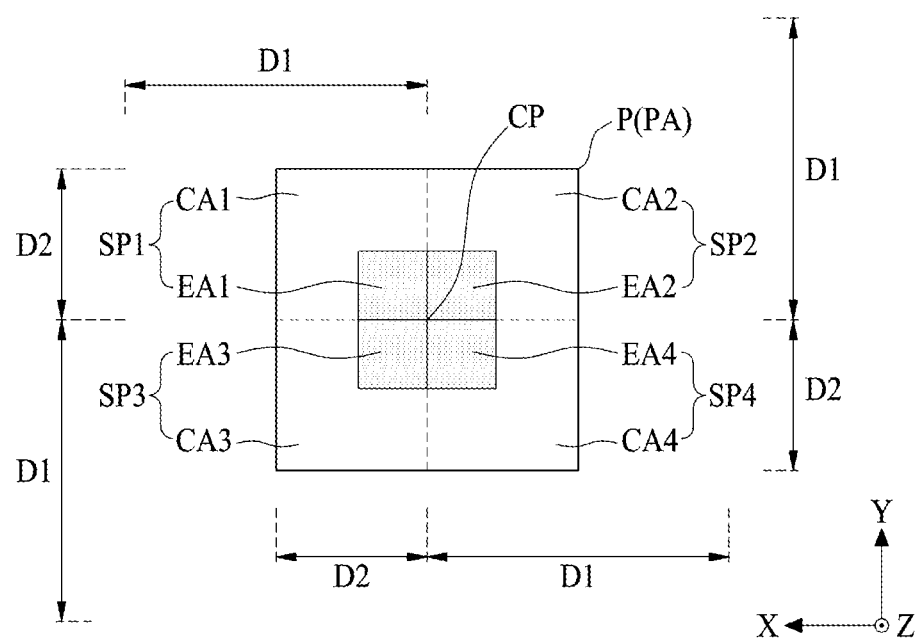
FIG. 2A is a diagram illustrating one pixel according to an embodiment of the present disclosure illustrated in FIG. 1.
Figure 2B:
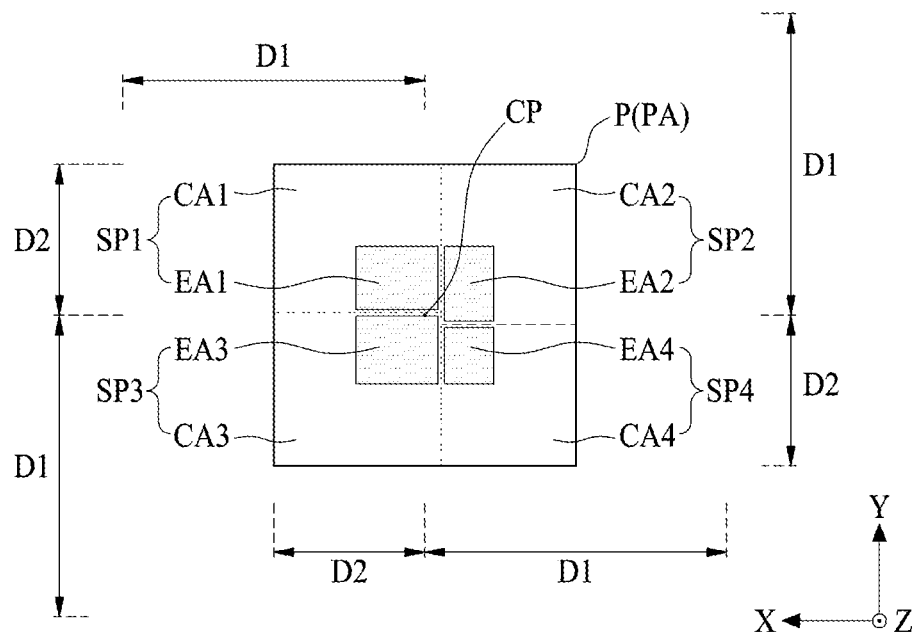
FIG. 2B is a diagram illustrating one pixel according to another embodiment of the present disclosure illustrated in FIG. 1.
Figure 2C:
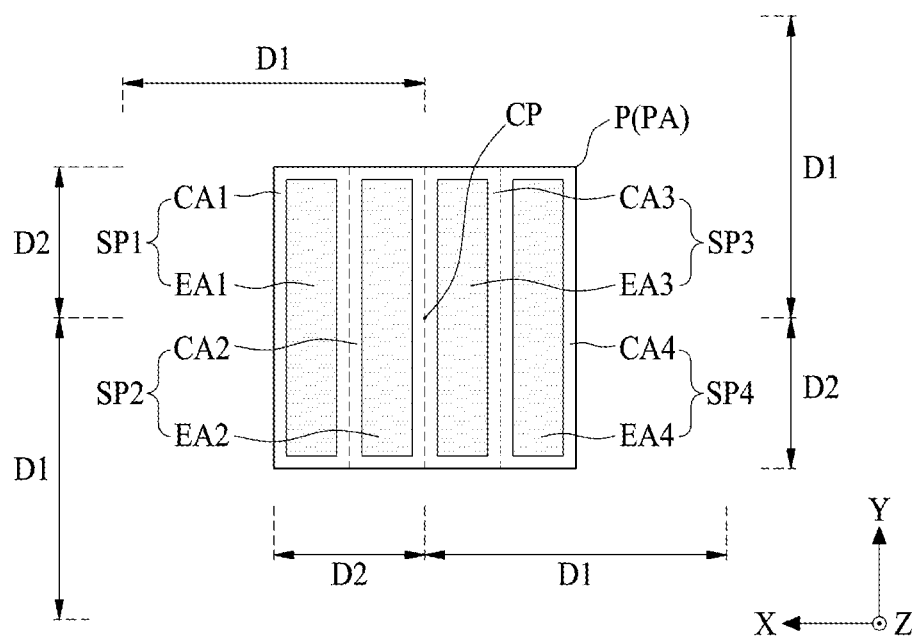
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 according to an embodiment may be disposed in a 2×2 form or a quad structure. The first to fourth subpixels SP1 to SP4 may each include a plurality of emission areas EA1 to EA4 and a plurality of circuit areas CA1 to CA4. For example, the emission areas EA1 to EA4 may be referred to as an opening area, an opening portion, or an emission portion.

The emission areas EA1 to EA4 of each of the first to fourth subpixels SP1 to SP4 may have a uniform quad structure to have a square shape having the same size (or same area). According to an embodiment, each of the emission areas EA1 to EA4 having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, each of the emission areas EA1 to EA4 having a uniform quad structure may be disposed at the center portion CP of the corresponding subpixel area to have a size which is less than each of four equal division regions of the pixel P.

Referring to FIGS. 1 and 2B, each of the first to fourth subpixels SP1 to SP4 according to another embodiment may have a non-uniform quad structure having different sizes. For example, each of the emission areas EA1 to EA4 of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality. According to another embodiment, when the emission areas EA1 to EA4 have a non-uniform quad structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure may be disposed to be concentrated around (or near) the center portion CP of the pixel P.

Referring to FIGS. 1 and 2C, each of the first to fourth subpixels SP1 to SP4 according to another embodiment may have a 1×4 form or a uniform stripe structure. For example, the emission areas EA1 to EA4 of the first to fourth subpixels SP1 to SP4 may have a 1×4 form or a uniform stripe structure.

The emission areas EA1 to EA4 of the first to fourth subpixels SP1 to SP4 having the uniform stripe structure may each have a rectangular shape which includes a short side parallel to the first direction X and a long side parallel to the second direction Y.

According to an embodiment, each of the emission areas EA1 to EA4 having the uniform stripe structure may be disposed close to a center portion CP of the pixel P within a corresponding subpixel area to have a size which is less than each of four equal division regions of the pixel P or may be disposed to be concentrated at the center portion of the pixel P.

According to another embodiment, each of the emission areas EA1 to EA4 having the uniform stripe structure may be disposed at center portion CP of the corresponding subpixel area to have a size which is less than each of four equal division regions of the pixel P.

According to another embodiment, each of the emission areas EA1 to EA4 having the uniform stripe structure may be disposed at the whole corresponding subpixel area to have the same size as each of four equal division regions of the pixel P.

Alternatively, each of the emission areas EA1 to EA4 of each of the first to fourth subpixels SP1 to SP4 may have a non-uniform stripe structure having different sizes. According to an embodiment, when the emission areas EA1 to EA4 have a non-uniform stripe structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring to FIGS. 2A and 2B, the circuit areas CA1 to CA4 of each of the first to fourth subpixels SP1 to SP4 may be disposed around (or near) a corresponding emission area of the emission areas EA1 to EA4. Each of the circuit areas CA1 to CA4 may include a pixel circuit and pixel driving lines for making a corresponding subpixel of the first to fourth subpixels SP1 to SP4 to emit. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, since the emission areas EA1 to EA4 of the first to fourth subpixels SP1 to SP4 have a top emission structure, each of the emission areas EA1 to EA4 may be arranged to overlap the corresponding circuit areas of the circuit areas CA1 to CA4. In this case, each of the emission areas EA1 to EA4 may have a size which is equal to or greater than the corresponding circuit areas CA1 to CA4.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. As an embodiment, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

Optionally, a white subpixel implemented to emit white light of the first to fourth subpixels SP1 to SP4 having a uniform stripe structure or a non-uniform stripe structure may be omitted.

Figure 3:
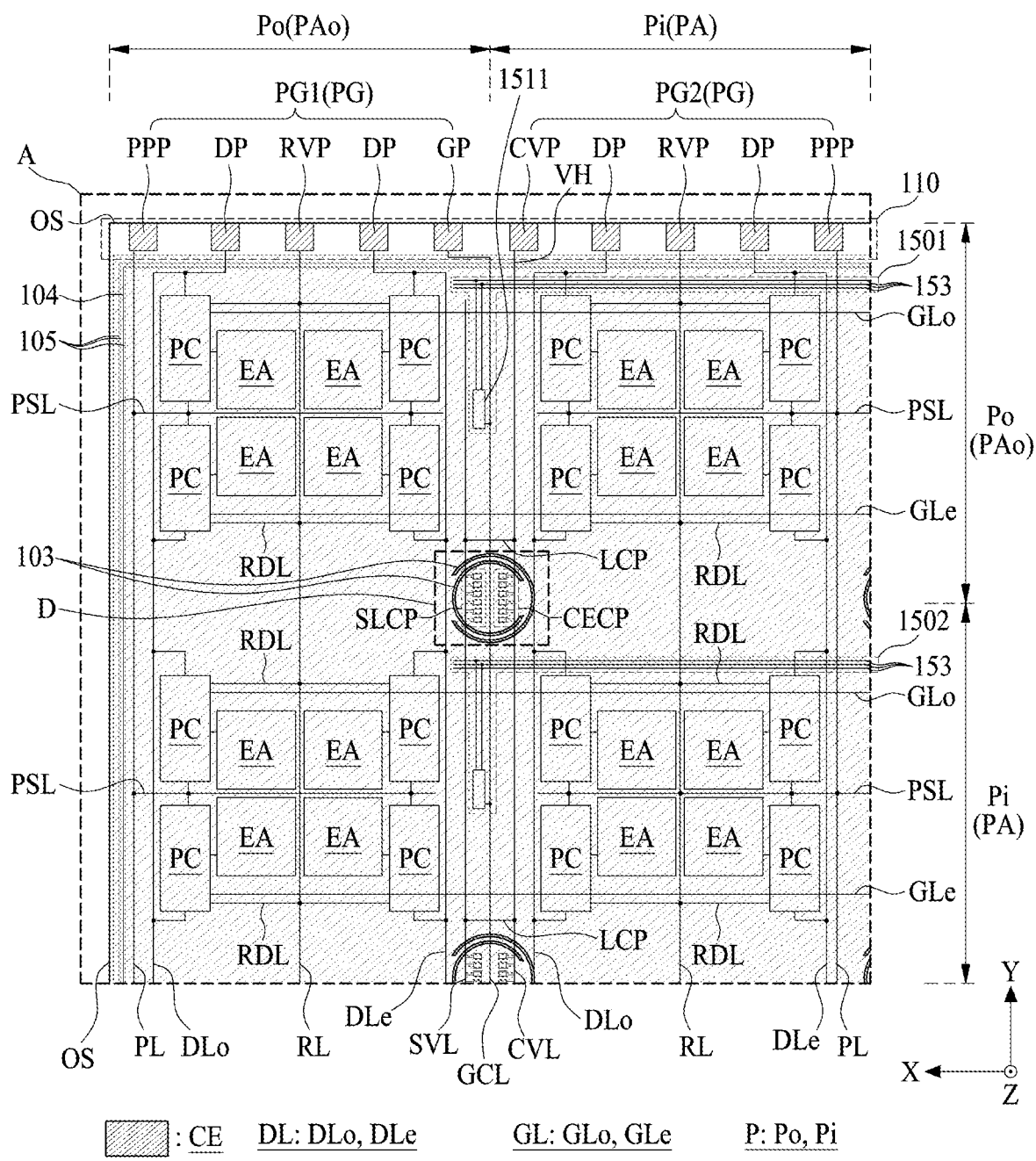
FIG. 3 is an enlarged view of a region 'A' illustrated in FIG. 1.
Figure 4:
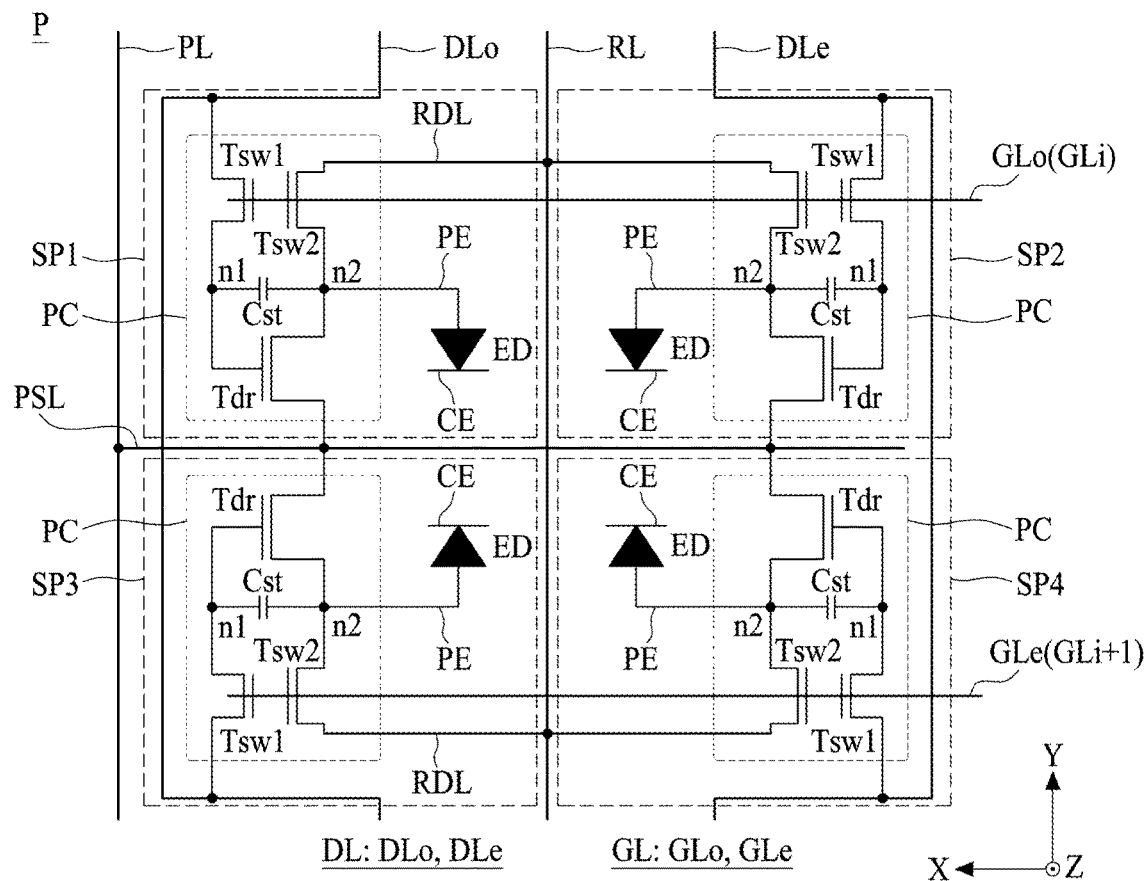
FIG. 4 is an equivalent circuit diagram illustrating one pixel having four subpixels of the type illustrated in FIGS. 1 and 3.

FIG. 3 is an enlarged view of a region 'A' illustrated in FIG. 1, and FIG. 4 is an equivalent circuit diagram illustrating one subpixel illustrated in FIGS. 1 and 3.

Referring to FIGS. 1, 3, and 4, a substrate 100 according to an embodiment of the present disclosure may include pixel driving lines DL, GL, PL, CVL, RL, and GCL, a plurality of pixels P, a common electrode CE, a plurality of common electrode connection portions CECP, a plurality of inner device isolation portions 103, a dam 104, an outer device isolation portion 105, and a pad part 110.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and gate control lines GCL.

The plurality of data lines DL may extend long in a second direction Y and may be disposed spaced apart from one another by a predetermined interval in a display area AA of the substrate 100 along the first direction X. For example, in the plurality of data lines DL, an odd-numbered data line DLo may be disposed at a first periphery portion of each of a plurality of pixel areas PA arranged at the substrate 100 along the second direction Y, and an even-numbered data line DLe may be disposed at a second periphery portion of each of the plurality of pixel areas PA arranged at the substrate 100 along the second direction Y, but embodiments of the present disclosure are not limited thereto.

The plurality of gate lines GL may extend long in the first direction X and may be disposed spaced apart from one another by a predetermined interval in the display area AA of the substrate 100 along the second direction Y. For example, an odd-numbered gate line GLo of the plurality of gate lines GL may be disposed at a third periphery portion of each of the plurality of pixel areas PA arranged on the substrate 100 along the first direction X. An even-numbered gate line GLe of the plurality of gate lines GL may be disposed at a fourth periphery portion of each of the plurality of pixel areas PA arranged at the substrate 100 along the first direction X, but embodiments of the present disclosure are not limited thereto.

The plurality of pixel driving power lines PL may extend long in the second direction Y and may be disposed spaced apart from one another by a predetermined interval in the display area AA of the substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X, but embodiments of the present disclosure are not limited thereto.

Two adjacent pixel driving power lines PL of the plurality of pixel driving power lines PL may be coupled to a plurality of power sharing lines PSL disposed in each of pixel areas PA arranged in the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the light emitting display apparatus according to an embodiment of the present disclosure may prevent or minimize the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long in the second direction Y and may be disposed spaced apart from one another by a predetermined interval in the display area AA of the substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed spaced apart from one another by a predetermined interval in the display area AA of the substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

Each of the plurality of gate control lines GCL may extend long in the second direction Y and may be disposed spaced apart from one another by a predetermined interval in the display area AA of the substrate 100 in the first direction X. For example, each of the plurality of gate control lines GCL may be disposed at between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment may be disposed in a circuit area of the pixel area PA and may be coupled to a gate line GLo or GLe adjacent thereto, a data line DLo or DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GL (GLo or GLe) a first source/drain electrode coupled to a corresponding data line DL (DLo or DLe), and a second source/drain electrode coupled to a gate node n1 of the driving TFT Tdr. The first switching TFT Tsw1 may be turned on by a scan signal supplied through corresponding gate line GL (GLo or GLe) and may transfer a data signal, supplied through corresponding data line DL (DLo or DLe), to the gate electrode n1 of the driving TFT Tdr.

The second switching TFT Tsw2 may include a gate electrode coupled to a corresponding gate line GL (GLo or GLe) a first source/drain electrode coupled to a source node n2 of the driving TFT Tdr, and a second source/drain electrode coupled to a corresponding reference voltage line RL. The second switching TFT Tsw2 may be turned on by a scan signal supplied through the corresponding gate line GL (GLo or GLe) and may transfer a reference voltage, supplied through the corresponding reference voltage line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) coupled to the second source/drain electrode of the first switching TFT Tsw1 and the first capacitor electrode of the storage capacitor Cst in common, a first source/drain electrode (or the source node n2) coupled to the first source/drain electrode of the second switching TFT Tsw2, the second capacitor electrode of the storage capacitor Cst, and a pixel electrode PE of the light emitting device layer in common, and a second source/drain electrode (or a drain node) coupled to a corresponding pixel driving power line PL. The driving TFT Tdr may be turned on based on a voltage of the storage capacitor Cst and may control the amount of current flowing from the pixel driving power line PL to the light emitting device layer.

The light emitting device layer may be disposed in an emission area EA of the pixel area PA and electrically coupled to the pixel circuit PC.

The light emitting device layer according to an embodiment of the present disclosure may include a pixel electrode PE electrically coupled to the pixel circuit PC, a common electrode CE electrically coupled to the pixel common voltage line CVL, and a self-emitting device ED interposed between the pixel electrode PE and the common electrode CE.

The pixel electrode PE may be referred to as an anode electrode, a reflective electrode, a lower electrode, an anode, or a first electrode of the self-emitting device ED.

The pixel electrode PE may overlap an emission area EA of each of the plurality of pixel areas PA. The pixel electrode PE may be patterned in an island shape and disposed in each pixel area PA, and may be electrically coupled to the first source/drain electrode (or the source node n2) of the driving TFT Tdr of a corresponding pixel circuit PC. One side of the pixel electrode PE may extend onto the first source/drain electrode of the driving TFT Tdr and may be electrically coupled to the first source/drain electrode of the driving TFT Tdr through an electrode contact hole provided in the planarization layer over the driving TFT Tdr.

The self-emitting device ED may be disposed over the pixel electrode PE and may directly contact the pixel electrode PE. The self-emitting device ED may be a common layer or a common device layer which is formed in common in each of a plurality of subpixels SP so as not to be distinguished by subpixel SP units. The self-emitting device ED may react on a current flowing between the pixel electrode PE and the common electrode CE to emit white light or blue light.

The common electrode CE may be disposed over the display area AA of the substrate 100 and may be electrically coupled to the self-emitting device ED in each of a plurality of subpixels SP. For example, the common electrode CE may be disposed over the remaining display area AA of the substrate 100 except for the pad part 110 of the substrate 100.

Each of the plurality of common electrode connection portions CECP may be disposed between the plurality of pixels P respectively overlapping the plurality of pixel common voltage lines CVL and may electrically couple the common electrode CE to each of the plurality of pixel common voltage lines CVL. With respect to each of the first direction X and the second direction Y, each of the plurality of common electrode connection portions CECP according to an embodiment of the present disclosure may be electrically coupled to each of the plurality of pixel common voltage lines CVL at a portion between two adjacent pixels P and may be electrically coupled to a portion of the common electrode CE, and thus, may electrically couple the common electrode CE to each of the plurality of pixel common voltage lines CVL. For example, the common electrode CE may be coupled to each of the plurality of common electrode connection portions CECP by a side contact structure corresponding to an undercut structure.

Each of the plurality of common electrode connection portions CECP may be disposed between two pixels along the first direction X and the second direction Y to electrically couple the common electrode CE to each of the plurality of pixel common voltage lines CVL, and thus, may prevent or minimize the voltage drop (IR drop) of the pixel common voltage caused by a surface resistance of the common electrode CE. Accordingly, the light emitting display apparatus according to an embodiment of the present disclosure may prevent or minimize the degradation in image quality caused by a deviation of the pixel common voltage supplied to each of the pixels P arranged in the display area AA.

Each of the plurality of inner device isolation portions 103 may isolate (or disconnect) the light emitting device layer adjacent to or near each of the plurality of common electrode connection portions CECP to block or maximally extend an inner water penetration path, thereby preventing or minimizing a reduction in reliability of the light emitting device layer caused by the inner penetration of water (or moisture). For example, each of the plurality of inner device isolation portions 103 may be implemented to maximally extend a water penetration path between each of the plurality of common electrode connection portions CECP and the emission area EA, and thus, may maximally delay an inner water penetration time for which water travels from each of the plurality of common electrode connection portions CECP to the emission area EA. In the following description, the inner device isolation portion 103 may be referred to as an inner isolation portion 103 or as an inner isolation member 103.

Each of the plurality of inner isolation portions (or members) 103 according to an embodiment may include first to $n^{th}$ (where n is a natural number of 2 or more) trench structures surrounding each of the plurality of common electrode connection portions CECP. For example, one inner isolation portion 103 may include the first to $n^{th}$ trench structures surrounding one common electrode connection portion CECP. A portion may also be considered a member since it is part of a structure or the structure itself.

The first to $n^{th}$ trench structures may include an undercut structure (or an eaves structure) for isolating (or disconnecting) a light emitting device layer disposed adjacent to or near a corresponding common electrode connection portion CECP. For example, the first to $n^{th}$ trench structures may include an undercut structure implemented in the insulation layer or an eaves structure implemented by the metal layer, in a stack structure of the insulation layer and the metal layer.

Each of the first to $n^{th}$ trench structures according to an embodiment may have an arc shape which includes an opening portion at one side thereof. Each of the first to $n^{th}$ trench structures may have an arc shape which is disposed in a concentric circle shape and is opened at one side thereof. For example, the first to $n^{th}$ trench structures may have a C-shape when viewed from a top plan view, but embodiments of the present disclosure are not limited thereto.

According to an embodiment, an opening portion of a $k^{th}$ (where k is 1 to n−1) trench structure of the first to $n^{th}$ trench structures may be surrounded by a $k+1^{th}$ trench structure. For example, the opening portion of the $k^{th}$ trench structure and the opening portion of the $k+1^{th}$ trench structure may be toward different directions. For example, the opening portion of the $k^{th}$ trench structure and the opening portion of the $k+1^{th}$ trench structure may be toward opposite directions.

Each of the plurality of inner isolation portions 103 according to an embodiment may include a maze area between the first to $n^{th}$ trench structures based on an arrangement structure of the first to $n^{th}$ trench structures and may maximally extend a water penetration path between the plurality of common electrode connection portions CECP and the emission area EA. Accordingly, the inner isolation portion 103 may be referred to as the term such as an inner water penetration delay portion, an inner eaves structure, or a maze water penetration delay portion.

Each of the dam 104 and the outer isolation portion 105 may be disposed or implemented at a periphery portion of the outermost pixel Po or the substrate 100 to have a closed loop line shape (or a closed loop shape). This is as described with reference to FIG. 1, and thus, their repeated descriptions are omitted.

The pad part 110 may be disposed at a first periphery portion of the first surface of the substrate 100 parallel to the first direction X. The pad part 110 may be disposed at a third periphery portion of each of outermost pixel areas PAo disposed at the first periphery portion of the substrate 100. With respect to the second direction Y, an end portion of the pad part 110 may overlap or may be aligned with an end portion of each of the outermost pixel areas PAo. Therefore, the pad part 110 may be included (or disposed) in each of the outermost pixel areas PAo disposed at the first periphery portion of the substrate 100, and thus, a non-display area (or a bezel area) based on the first pad part 110 may not be formed or may not be in the substrate 100.

The pad part 110 may include a plurality of pads which are disposed in parallel with one another along the first direction X at the first periphery portion of the substrate 100. The plurality of pads may be grouped (or classified) into a first data pads DP, a first gate pads GP, a first pixel driving power pads PPP, a first reference voltage pads RVP, and a first pixel common voltage pads CVP.

Each of the first data pads DP may be individually (or a one-to-one relationship) coupled to one side of each of the plurality of data lines DLo and DLe disposed at the substrate 100.

Each of the first gate pads GP may be individually (or a one-to-one relationship) coupled to one side of each of the gate control lines GCL disposed at the first substrate 100. The first gate pads GP according to an embodiment may be grouped (or classified) into a first start signal pad, a plurality of first shift clock pads, a plurality of first carry clock pads, at least one first gate driving power pad, and at least one first gate common power pad.

Each of the first pixel driving power pads PPP may be individually (or a one-to-one relationship) coupled to one side end of each of the plurality of pixel driving power lines PL disposed at the substrate 100. Each of the first reference voltage pads RVP may be individually (or a one-to-one relationship) coupled to one side end of each of the plurality of reference voltage lines RL disposed at the substrate 100. Each of the first pixel common voltage pads CVP may be individually (or a one-to-one relationship) coupled to one side end of each of the plurality of pixel common voltage lines CVL disposed at the substrate 100.

The pad part 110 according to an embodiment may include a plurality of pad groups PG which are arranged in the order of a first pixel driving power pad PPP, a first data pad DP, a first reference voltage pad RVP, a first data pad DP, a first gate pad GP, a first pixel common voltage pad CVP, a first data pad DP, a first reference voltage pad RVP, a first data pad DP, and a first pixel driving power pad PPP along the first direction X. Each of the plurality of pad groups PG may be coupled to two adjacent pixels P disposed along the first direction X. For example, the plurality of pad groups PG may include a first pad group PG1 including a first pixel driving power pad PPP, a first data pad DP, a first reference voltage pad RVP, a first data pad DP, and a first gate pad GP continuously disposed in an odd-numbered pixel area PA along the first direction X, and a second pad group PG2 including a first pixel common voltage pad CVP, a first data pad DP, a first reference voltage pad RVP, a first data pad DP, and a first pixel driving power pad PPP continuously disposed in an even-numbered pixel area PA along the first direction X.

It is to be noted in the Figures, where a reference number or letter is provided after which another reference number or letter is provided in parenthesis, this has the meaning that the number and/or letter in parenthesis is the general category or group of the item and the first number prior to it is a specific example of that item within the group. For example, the indication in FIG. 3 of PG1(PG) indicates that PG1, the first pad group, is a specific item within the broad pad group, PG. Similarly, in FIG. 5, the notation 150m(150) indicates that each of the circuits 1501, 1502, . . . 1511, 1512 etc. is driving circuit within the broad group of driving circuits 150. In addition, the notation 111(110) in FIGS. 13A-13D indicates that item 111 is one specific first pad within the group of first pads 110. Similar meanings apply to similar notations in the Figures and these are provided as examples to illustrate the meaning.

In a somewhat similar fashion, the legend below a particular figure provides a general group and is followed by a colon and then a list of items in that group as shown in the figure. For example, the notation P: Po, Pi below FIG. 1 indicates that P is the general group of a pixel and Po and Pi are specific items within that group of Pixels P. Also, below FIG. 3, the notations DL: DLo and DLe and GL: GLo and GLe indicate that each of these are specific items within the general group of data lines DL and gate lines GL, respectively.

The substrate 100 according to an embodiment of the present disclosure may further include a plurality of secondary voltage lines SVL and a plurality of secondary line connection portions SLCP. For example, the secondary voltage lines may be referred to as an additional voltage lines or an auxiliary voltage lines, or the like.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically coupled to an adjacent pixel common voltage line CVL without being electrically coupled to the pixel common voltage pad CVP and may be supplied with a pixel common voltage through the adjacent pixel common voltage line CVL. To this end, the substrate 100 according to an embodiment of the present disclosure may further include a plurality of line connection patterns LCP which electrically couple a pixel common voltage line CVL and a secondary voltage lines SVL adjacent to each other.

Each of the plurality of line connection patterns LCP may be disposed at the substrate 100 so that the line connection pattern LCP and a pixel common voltage line CVL and a secondary voltage lines SVL adjacent to each other intersect with each other and may electrically couple a pixel common voltage line CVL and a secondary voltage lines SVL adjacent to each other by using a line jumping structure. For example, one side of each of the plurality of line connection patterns LCP may be electrically coupled to a portion of the secondary voltage lines SVL through a first line contact hole formed at an insulation layer over the secondary voltage lines SVL, and the other side of each of the plurality of line connection patterns LCP may be electrically coupled to a portion of the pixel common voltage line CVL through a second line contact hole formed at the insulation layer over the pixel common voltage line CVL.

Each of the plurality of secondary line connection portions SLCP may electrically couple the common electrode CE to each of the plurality of secondary voltage lines SVL at between the plurality of pixels P overlapping each of the plurality of secondary voltage lines SVL. With respect to the second direction Y, each of the plurality of secondary line connection portions SLCP according to an embodiment may be electrically coupled to each of the plurality of secondary voltage lines SVL at a portion between the plurality of pixels P or a boundary region between the plurality of pixels P, and may be electrically coupled to a portion of the common electrode CE, and thus, may electrically couple the common electrode CE to each of the plurality of secondary voltage lines SVL. Therefore, the common electrode CE may be additionally coupled to each of the plurality of secondary voltage lines SVL through the secondary line connection portions SLCP. Accordingly, the light emitting display apparatus according to an embodiment of the present disclosure may prevent or minimize the degradation in image quality caused by a deviation of the pixel common voltage supplied to each of the pixels P arranged in the display area AA. Also, in the light emitting display apparatus according to an embodiment of the present disclosure, although the pixel common voltage pad CVP coupled to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

Each of the plurality of secondary line connection portions SLCP according to an embodiment may have a symmetric structure with each of the plurality of common electrode connection portions CECP with respect to the gate control lines GCL. Thus, each of the plurality of secondary line connection portions SLCP may be surrounded by each of the plurality of inner isolation portions 103. For example, one inner isolation portion 103 may surround one common electrode connection portion CECP and one secondary line connection portions SLCP.

Figure 12:
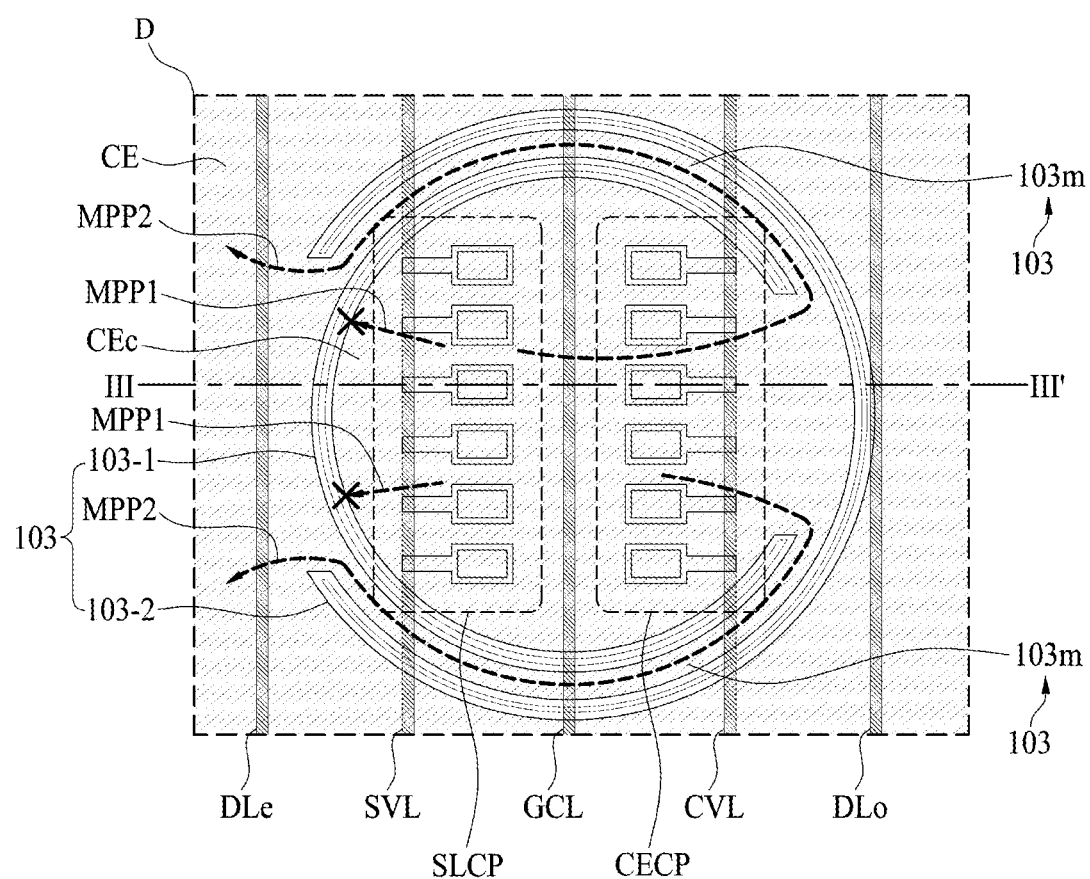
FIG. 12 is an enlarged view of a region 'D' illustrated in FIG. 3.
Figure 13:
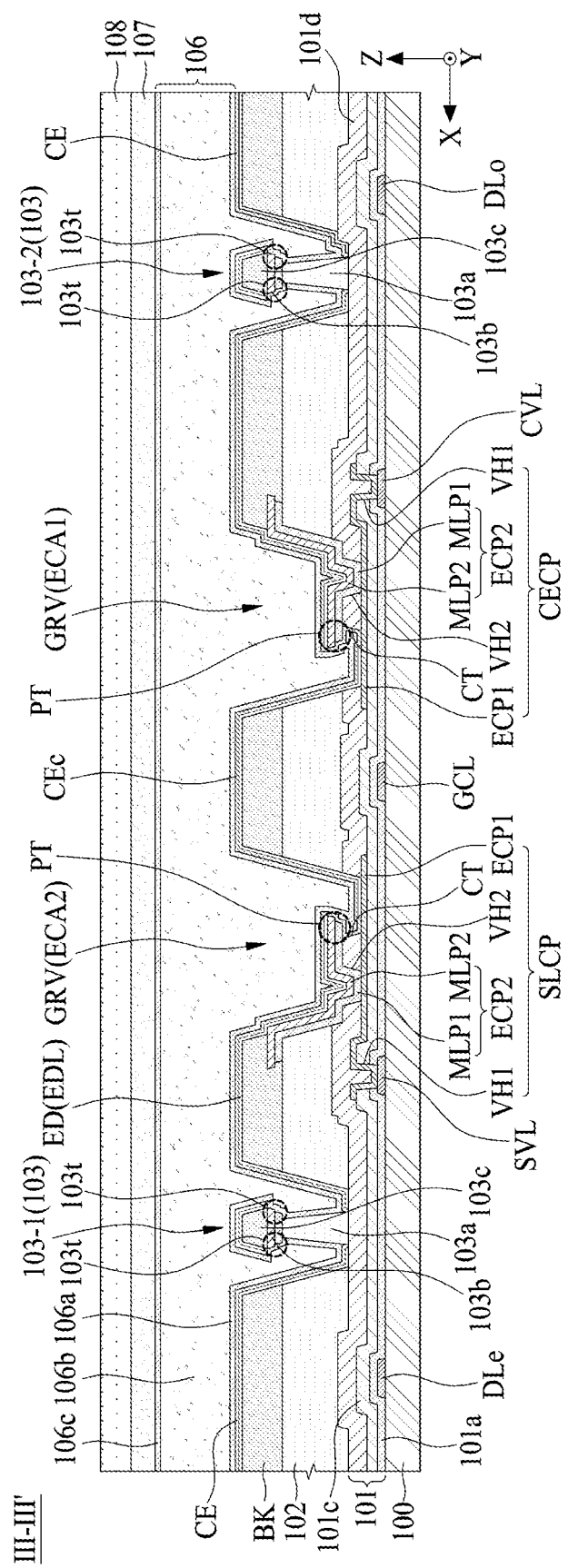
FIG. 13 is another cross-sectional view taken along line illustrated in FIG. 12.

According, as shown in FIG. 3, a substrate 100 has a plurality of pixels formed thereon, the pixels being arranged in adjacent rows and adjacent columns. There are a plurality of pixel driving power lines positioned between two adjacent columns of pixels. A plurality of electrode connection patterns, SLCP, having patterns ECP1 and ECP2, see FIGS. 12 and 13, are coupled to the respective pixel driving power lines at a location between two adjacent columns of pixels and two adjacent rows of pixels. a first isolation structure 103-1 surrounds the electrode connection patterns, the first isolation member being located between the two adjacent columns of pixels and the two adjacent rows of pixels.

There is a second isolation structure 103-2 surrounding the first isolation structure. The second isolation structure 103-2 is a circular member having an opening located adjacent to a wall portion of the first isolation structure 103-1. Further, the first isolation structure 103-1 includes an opening positioned opposite the opening of the second isolation structure. Thus, each of the isolation structures 103-1 and 103-2 can both be C-shaped, with the opening of the C of each one opposite each other and facing the wall of the other opening.

The substrate 100 according to an embodiment of the present disclosure may further include an encapsulation layer.

The encapsulation layer may be implemented to surround the light emitting device layer. The encapsulation layer according to an embodiment may include a first inorganic encapsulation layer (or a first encapsulation layer) disposed over the light emitting device layer, the dam 104, and the outer device isolation portion 105, a second inorganic encapsulation layer (or a third encapsulation layer) disposed over the first inorganic encapsulation layer, and an organic encapsulation layer (or a second encapsulation layer) interposed between the first inorganic encapsulation layer and the second inorganic encapsulation layer disposed over an encapsulation area defined by the dam 104.

The organic encapsulation layer may cover a top surface (or an upper surface) of the light emitting device layer and flow toward the end portion of the substrate 100, and the spread (or flow) of the organic encapsulation layer may be blocked by the dam 104. The dam 104 may define or limit a disposition region (or a encapsulation region) of the organic encapsulation layer, moreover, and may block or prevent the spread or overflow of the organic encapsulation layer.

Figure 5:
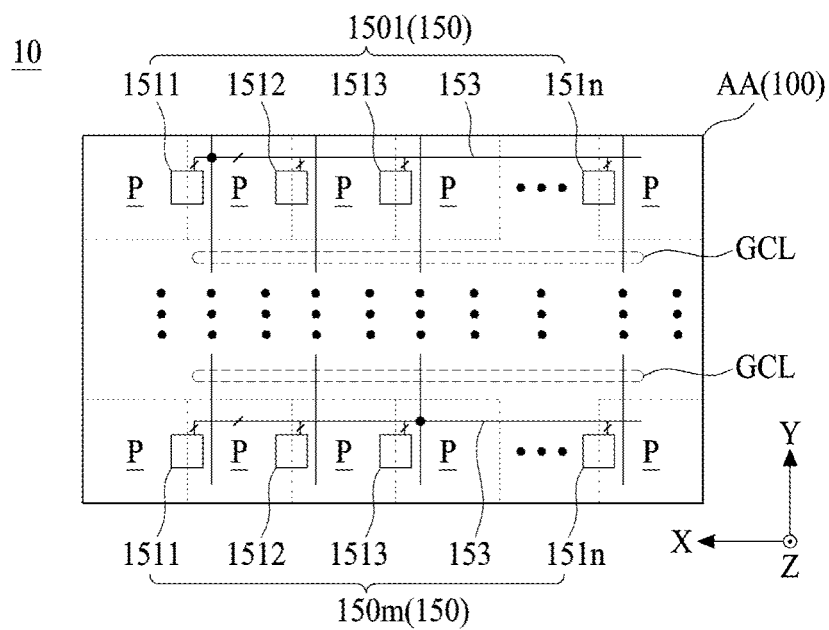
FIG. 5 is a diagram illustrating a gate driving circuit illustrated in FIGS. 1 and 3.

FIG. 5 is a diagram illustrating a gate driving circuit illustrated in FIGS. 1 and 3.

Referring to FIGS. 1, 3, and 5, the gate driving circuit 150 according to another embodiment of the present disclosure may be implemented (or embedded) within the display area AA of the substrate 100. The gate driving circuit 150 may generate a scan signal based on gate control signals supplied through the pad part 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined interval in a display area AA of the substrate 100 along the first direction X. For example, the gate control lines GCL may be disposed between at least one or more pixels P along the first direction X.

The gate driving circuit 150 according to an embodiment of the present disclosure may be implemented with a shift register including a plurality of stage circuit portions 1501 to 150$m$, where m is an integer of 2 or more.

Each of the plurality of stage circuit portions 1501 to 150$m$ may be individually disposed in each horizontal line of a first surface of the substrate 100 along the first direction X and may be dependently coupled to one another along the second direction Y. Each of the plurality of stage circuit portions 1501 to 150$m$ may generate a scan signal in a predetermined order in response to gate control signals supplied through the pad part 110 and the gate control lines GCL and may supply the scan signal to a corresponding gate line GL.

Each of the plurality of stage circuit portions 1501 to 150$m$ according to an embodiment may include a plurality of branch circuits 1511 to 151$n$ and a branch network 153.

The plurality of branch circuits 1511 to 151$n$ may be selectively coupled to the lines of the gate control lines GCL through the branch network 153 and may be electrically coupled to one another through the branch network 153. Each of the plurality of branch circuits 1511 to 151$n$ may generate the scan signal based on a gate control signal supplied through the gate control lines GCL and a voltage of the branch network 153, and may supply the scan signal to a corresponding gate line GL.

Each of the plurality of branch circuits 1511 to 151$n$ may include at least one TFT (or branch TFT) of a plurality of TFTs configuring one stage circuit portion of the stage circuit portions 1501 to 150$m$. Any one branch circuit of the plurality of branch circuits 1511 to 151$n$ may include a pull-up TFT coupled to the gate line GL. The other branch circuit of the plurality of branch circuits 1511 to 151$n$ may include a pull-down TFT coupled to the gate line GL.

Each of the plurality of branch circuits 1511 to 151n according to an embodiment of the present disclosure may be disposed at a circuit area between two adjacent pixels P or at a circuit area between at least two adjacent pixels P, in each horizontal line of the substrate 100, but embodiments of the present disclosure are not limited thereto. For example, each of the plurality of branch circuits 1511 to 151n may be disposed at a circuit area (or a boundary region) between at least one or more adjacent pixels P according to the number of TFTs configuring each of the stage circuit portions 1501 to 150m and the number of pixels P disposed one horizontal line.

The branch network 153 may be disposed at each horizontal line of the substrate 100 and may electrically couple the plurality of branch circuits 1511 to 151n to each other. The branch network 153 according to an embodiment of the present disclosure may include a plurality of control node lines and a plurality of network line.

The plurality of control node lines may be disposed at each horizontal line of the substrate 100 and may be selectively coupled to the plurality of branch circuits 1511 to 151n in one horizontal line. For example, the plurality of control node lines may be disposed at an upper edge region (or a lower edge region) among pixel areas arranged at each horizontal line of the substrate 100.

The plurality of network line may be selectively coupled to the gate control lines GCL disposed at the substrate 100 and may be selectively coupled to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

As described above, according to an embodiment of the present embodiment, because the gate driving circuit 150 is disposed within the display area AA of the substrate 100, a second interval D2 between a center portion of the outermost pixel area PAo and the outer surfaces OS of the substrate 100 may be equal to or less than half of a first interval (or a pixel pitch) D1 between adjacent pixel areas PA. For example, when the gate driving circuit 150 is not disposed in the display area AA of the substrate 100 and is disposed at a periphery portion of the substrate 100, the second interval D2 may not be equal to or less than half of the first interval D1. Accordingly, in the light emitting display apparatus according to an embodiment of the present disclosure, the gate driving circuit 150 may be disposed in the display area AA of the substrate 100, and thus, the second interval D2 may be implemented to be equal to or less than half of the first interval D1, and moreover, the display apparatus may be implemented to have an air bezel structure which has a zero bezel, namely a bezel area is not provided.

Figure 6:
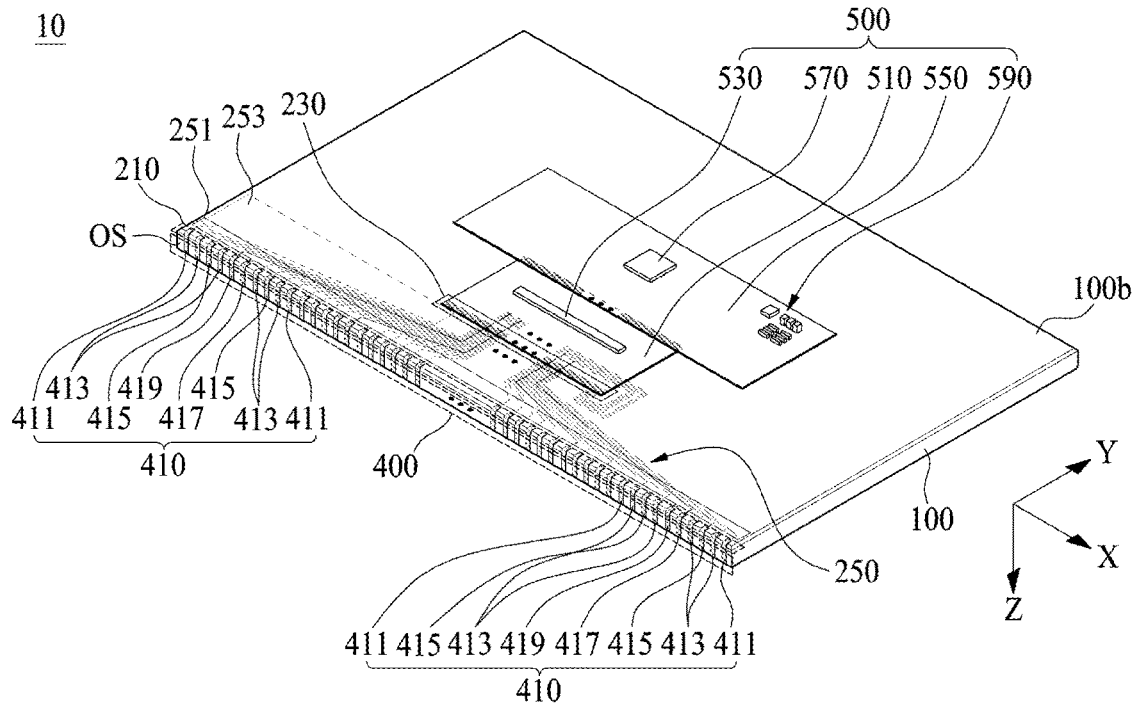
FIG. 6 is a diagram illustrating a rear surface of a light emitting display apparatus according to an embodiment of the present disclosure.

FIG. 6 is a diagram illustrating a rear surface of a light emitting display apparatus according to an embodiment of the present disclosure.

Referring to FIGS. 1, 3, and 6, the light emitting display apparatus according to an embodiment of the present disclosure may further include a second pad part 210 disposed at a rear surface (a backside surface) 100b of the substrate 100.

The second pad part 210 may be disposed at one periphery portion (or a first rear periphery portion) of a rear surface 100b of the substrate 100 overlapping the pad part 110 disposed at a front surface of the substrate 100. In the following description of FIG. 6, the pad part 110 which is disposed at a front surface of the substrate 100 may be referred to as a first pad part 110.

The second pad part 210 may include a plurality of second pads (or routing pads) which are arranged at a certain interval along the first direction X to respectively overlap the pads of the first pad part 110. In the following description of FIG. 6, a pad of the pad part 110 may be referred to as a first pad.

The plurality of second pads may be grouped (or classified) into second pixel driving power pads overlapping each of the first pixel driving power pads PPP of the first pad part 110, second data pads overlapping each of the first data pads DP of the first pad part 110, second reference voltage pads overlapping each of the first reference voltage pads RVP of the first pad part 110, second gate pads overlapping each of the first gate pads GP of the first pad part 110, and second pixel common voltage pads overlapping each of the first pixel common voltage pads CVP of the first pad part 110.

The light emitting display apparatus according to an embodiment of the present disclosure may further include at least one third pad part 230 and a link line part 250 which are disposed over the rear surface 100b of the substrate 100.

The at least one third pad part 230 (or an input pad part) may be disposed at the rear surface 100b of the substrate 100. For example, the at least one third pad part 230 may be disposed at a middle portion adjacent to the first periphery portion of the rear surface 100b of the substrate 100. The at least one third pad part 230 according to an embodiment of the present disclosure may include a plurality of third pads (or input pads) which are spaced apart from one another by a certain interval. For example, the at least one third pad part 230 may include third pixel driving power pads, third data pads, third reference voltage pads, third gate pads, and third pixel common voltage pads.

The link line part 250 may include a plurality of link lines disposed between the second pad part 210 and the at least one third pad part 230.

The link line part 250 according to an embodiment of the present disclosure may include a plurality of pixel driving power link lines which individually (or a one-to-one relationship) couple the second pixel driving power pads to the third pixel driving power pads, a plurality of data link lines which individually (or a one-to-one relationship) couple the second data pads to the third data pads, a plurality of reference voltage link lines which individually (or a one-to-one relationship) couple the second reference voltage pads to the third reference voltage pads, a plurality of gate link lines which individually (or a one-to-one relationship) couple the second gate pads to the third gate pads, and a plurality of pixel common voltage link lines which individually (or a one-to-one relationship) couple the second pixel common voltage pads to the third pixel common voltage pads.

Each of the plurality of pixel common voltage link lines may include a first common link line 251 and a second common link line 253. The first common link line 251 may be disposed between the second pad part 210 and the at least one third pad part 230 and commonly coupled to the plurality of second pixel common voltage pads. The second common link line 253 may be commonly coupled to the plurality of third pixel common voltage pads and electrically coupled to the first common link line 251. The second common link line 253 may be disposed on a different layer from the first common link line 251 and may be electrically connected to the first common link line 251 through a via hole. A size of the second common link line 253 may progressively increase in a direction from the third pad part 230 to the periphery portion of the substrate 100 in order to reduce (or minimize) the voltage drop of the pixel common voltage.

The light emitting display apparatus according to an embodiment of the present disclosure may further include a routing portion 400 which is disposed at an outer surface OS of the substrate 100.

The routing portion 400 may be disposed to surround the first pad part 110, the outer surface OS, and the second pad part 210 of the substrate 100.

The routing portion 400 according to an embodiment may include a plurality of routing lines 410. Each of the plurality of routing lines 410 may be disposed at a certain interval along the first direction X, may be formed to surround the first pad part 110, the outer surface OS, and the second pad part 210 of the substrate 100, and may be electrically coupled to each of the first pads of the first pad part 110 and the second pads of the second pad part 210 in one-to-one relationship. According to an embodiment, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

The plurality of routing lines 410 according to an embodiment of the present disclosure may be grouped (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be formed to surround the first pad part 110, the outer surface OS, and the second pad part 210, and may be electrically coupled to the plurality of first pixel driving power pads of the first pad part 110 and the plurality of second pixel driving power pads of the second pad part 210 in a one-to-one relationship.

The plurality of data routing lines 413 may be formed to surround the first pad part 110, the outer surface OS, and the second pad part 210, and may be electrically coupled to the plurality of first data pads of the first pad part 110 and the plurality of second data pads of the second pad part 210 in a one-to-one relationship.

The plurality of reference voltage routing lines 415 may be formed to surround the first pad part 110, the outer surface OS, and the second pad part 210, and may be electrically coupled to the plurality of first reference voltage pads of the first pad part 110 and the plurality of second reference voltage pads of the second pad part 210 in a one-to-one relationship.

The plurality of gate routing lines 417 may be formed to surround the first pad part 110, the outer surface OS, and the second pad part 210, and may be electrically coupled to the plurality of first gate pads of the first pad part 110 and the plurality of second gate pads of the second pad part 210 in a one-to-one relationship.

The plurality of pixel common voltage routing lines 419 may be formed to surround the first pad part 110, the outer surface OS, and the second pad part 210, and may be electrically coupled to the plurality of first pixel common voltage pads of the first pad part 110 and the plurality of second pixel common voltage pads of the second pad part 210 in a one-to-one relationship.

The light emitting display apparatus or the routing portion 400 according to an embodiment may further include an edge coating layer.

The edge coating layer may be implemented to cover the plurality of routing portion 400. The edge coating layer according to an embodiment may be implemented to cover all of the first periphery portion and the first outer surface OS of the substrate 100 as well as the plurality of routing lines 410. The edge coating layer 450 may prevent the corrosion of each of the plurality of routing lines 410 including a metal material or electrical short circuit between the plurality of routing lines 410. Also, the edge coating layer may prevent or minimize the reflection of external light caused by the plurality of routing lines 410 and the first pads of the first pad part 110. The edge coating layer according to an embodiment may include a light blocking material including black ink. For example, the edge coating layer 450 may be an edge protection layer or an edge insulating layer.

The light emitting display apparatus according to an embodiment of the present disclosure may further include a driving circuit part 500.

The driving circuit part 500 may drive (or emit light) the pixels P disposed on the first substrate 100 based on digital video data and a timing synchronization signal supplied from a display driving system to allow the display area AA to display an image corresponding to image data. The driving circuit part 500 may be coupled to the at least one third pad part 230 disposed at the rear surface 100b of the substrate 100 and may output, to the at least one third pad part 230, a data signal, a gate control signal, and a driving power for driving (or emitting light) the pixels P disposed at the substrate 100.

The driving circuit part 500 according to an embodiment may include a flexible circuit film 510, a driving integrated circuit (IC) 530, a printed circuit board (PCB) 550, a timing controller 570, and a power circuit 590.

The flexible circuit film 510 may be connected to the at least one third pad part 230 disposed at the rear surface 100b of the substrate 100.

The driving IC 530 may be mounted on the flexible circuit film 510. The driving IC 530 may receive subpixel data and a data control signal provided from the timing controller 570, and convert the subpixel data into an analog data signal based on the data control signal to supply the analog data signal to a corresponding data line DL. The data signal may be supplied to a corresponding third data pads in the at least one third pad part 230 through the flexible circuit film 510.

The driving IC 530 may sense a characteristic value of a driving TFT disposed in the subpixel SP through the plurality of reference voltage lines RL (or pixel sensing line) disposed at the substrate 100, generate sensing raw data corresponding to a sensing value for each subpixel, and provide the sensing raw data for each subpixel to the timing controller 570.

The PCB 550 may be coupled to the other side of the periphery portion of the flexible circuit film 510. The PCB 550 may transfer a signal and power between elements of the driving circuit part 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The data control signal may be supplied to the driving IC 530 through the flexible circuit film 510.

The gate control signal according to an embodiment may include a start signal (or a gate start pulse), a plurality of shift clocks, a forward driving signal, and a reverse driving signal. In this case, the plurality of shift clocks may include a plurality of scan clocks where phases thereof are sequentially shifted and a plurality of carry clocks where phases thereof are sequentially shifted. Additionally, the gate control signal according to an embodiment may further include an external sensing line selection signal, an external sensing reset signal, and an external sensing control signal for sensing a characteristic value of the driving TFT disposed in the subpixel SP. The gate control signal may be supplied to the gate driving circuit 150 through the flexible circuit film 510, the at least one third pad part 230, the link line part 250, the second pad part 210, the routing portion 400, the first pad part 110, and gate control lines GCL.

The timing controller 570 may drive each of the driving IC 530 and the gate driving circuit 150 based on an external sensing mode during a predetermined external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel. For example, the timing controller 570 may drive each of the driving IC 530 and the gate driving circuit 150 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment may store the sensing raw data of each subpixel, provided from the driving IC 530, in a storage circuit based on the external sensing mode. Also, in a display mode, the timing controller 570 may correct pixel data which is to be supplied to each subpixel, based on the sensing raw data stored in the storage circuit and may provide corrected pixel data to the driving IC 530. Here, sensing raw data of each subpixel may include sequential variation information about each of a driving TFT and a self-emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel, thereby minimizing or preventing the degradation in image quality caused by a characteristic value deviation of driving TFTs of a plurality of subpixels. The external sensing mode of a display apparatus may be technology known to those skilled in the art, and thus, its detailed description is omitted. For example, the display apparatus according to an embodiment of the present disclosure may sense a characteristic value of the driving TFT disposed in each subpixel P based on a sensing mode disclosed in Korean Patent Publication No. 10-2016-0093179, 10-2017-0054654, or 10-2018-0002099.

The power circuit 590 may be mounted on the PCB 550 and may generate various source voltages needed for displaying an image on the pixels P by using an input power supplied from the outside to provide the generated source voltage to a corresponding circuit. For example, the power circuit 590 may generate and output a logic source voltage needed for driving of each of the timing controller 570 and the driving IC 530, the plurality of reference gamma voltages provided to the driving IC 530, and at least one gate driving power and at least one gate common power needed for driving of the gate driving circuit 150. Also, the power circuit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Figure 7:
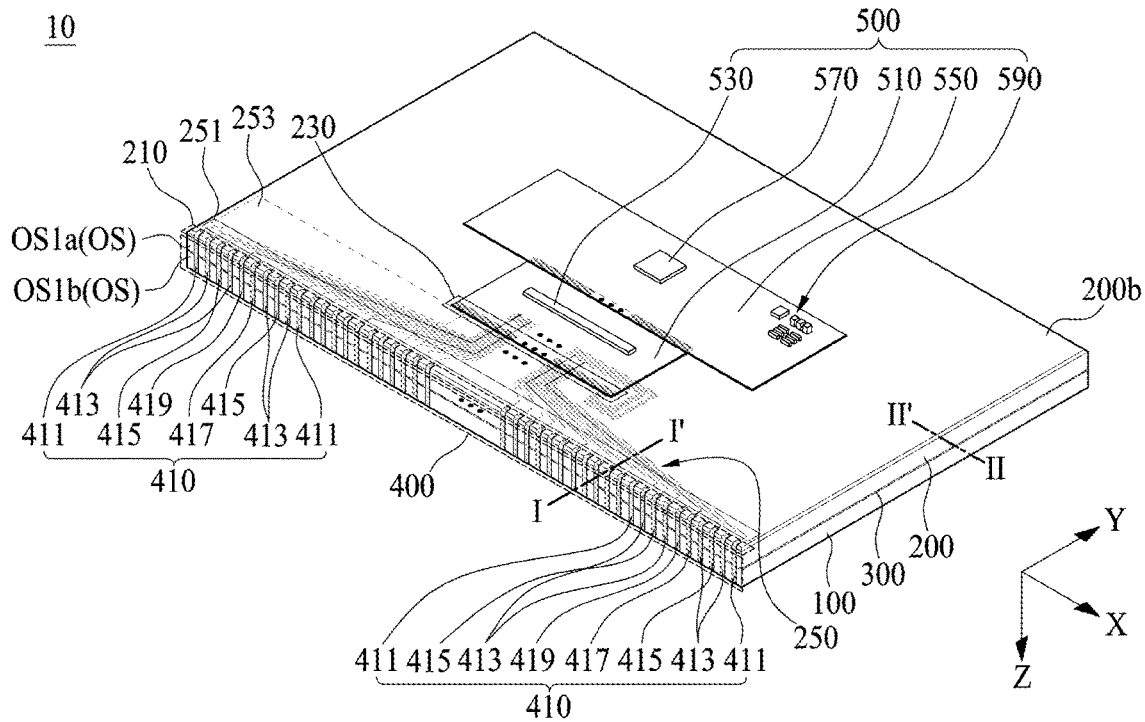
FIG. 7 is a diagram illustrating a rear surface of a light emitting display apparatus according to another embodiment of the present disclosure.

FIG. 7 is a rear perspective view illustrating a light emitting display apparatus according to another embodiment of the present disclosure, and illustrates an embodiment where a wiring substrate is additionally provided in the light emitting display apparatus illustrated in FIGS. 1 to 6.

Referring to FIG. 7, the light emitting display apparatus according to another embodiment of the present disclosure may include a substrate 100, a second substrate 200, a coupling member 300, and a routing portion 400.

The substrate 100 may be referred to as a display substrate, a pixel array substrate, an upper substrate, a front substrate, or a base substrate. The substrate 100 may be a glass substrate, or may be a thin glass substrate or a plastic substrate, which is bendable or flexible. In the following description of FIG. 7, the substrate 100 may be referred to as a first substrate 100.

The first substrate 100 may be substantially the same as the substrate 100 of the light emitting display apparatus illustrated in FIGS. 1 to 6, and thus, like reference numerals refer to like elements and their repetitive descriptions may be omitted.

The second substrate 200 may be referred to as a wiring substrate, a line substrate, a link substrate, a lower substrate, a rear substrate, or link glass. The second substrate 200 may be a glass substrate, or may be a thin glass substrate or a plastic substrate, which is bendable or flexible. For example, the second substrate 200 may include the same material as the first substrate 100. A size of the second substrate 200 may be the same as the first substrate 100, but embodiments of the present disclosure are not limited thereto, the size of the second substrate 200 may have a less than the first substrate 100. For example, the second substrate 200 may be configured to have the same size as the first substrate 100 in order to maintain or secure the stiffness of the first substrate 100.

The second substrate 200 may include a second pad part 210, at least one third pad part 230, and a link line portion

250. Except for that the second pad part 210, the at least one third pad part 230, and the link line portion 250 are disposed at a rear surface (or a backside surface) 200b of the second substrate 200, each of the second pad part 210, the at least one third pad part 230, and the link line portion 250 may substantially the same as each of the second pad part 210, the at least one third pad part 230, and the link line portion 250 illustrated in FIG. 6, and thus, like reference numerals refer to like elements and their repetitive descriptions may be omitted.

The second substrate 200 may be coupled (or connected) to a second surface (or a rear surface) of the first substrate 100 by using the coupling member 300. The coupling member 300 may be interposed between the first substrate 100 and the second substrate 200. Thus, the first substrate 100 and the second substrate 200 may be opposite-bonded to each other by the coupling member 300.

The routing portion 400 may be referred to as a side routing portion, a side wiring portion, a printing wiring portion, or a printing line portion. The routing portion 400 according to an embodiment may include a plurality of routing lines 410 which are disposed at each of a first outer surface (or one surface) OS1a among the outer surface OS of the first substrate 100 and a first outer surface (or one surface) OS1b among the outer surface OS of the second substrate 200. Except for that the plurality of routing lines 410 is disposed to surround the first pad part 110 and the first outer surface OS1a of the first substrate 100 and the second pad part 210 and the first outer surface OS1b of the second substrate 200, the routing portion 400 may substantially the same as the routing portion 400 illustrated in FIG. 6, and thus, like reference numerals refer to like elements and their repetitive descriptions may be omitted.

The light emitting display apparatus according to another embodiment of the present disclosure may further include a driving circuit part 500.

The driving circuit part 500 may include a flexible circuit film 510, a driving integrated circuit (IC) 530, a printed circuit board (PCB) 550, a timing controller 570, and a power circuit 590. Except for that the flexible circuit film 510 is connected to the at least one third pad part 230 disposed at the rear surface 200b of the second substrate 200, the driving circuit part 500 having such a configuration may be substantially the same as the driving circuit part 500 illustrated in FIG. 6, and thus, like reference numerals refer to like elements and their repetitive descriptions may be omitted.

Figure 8:
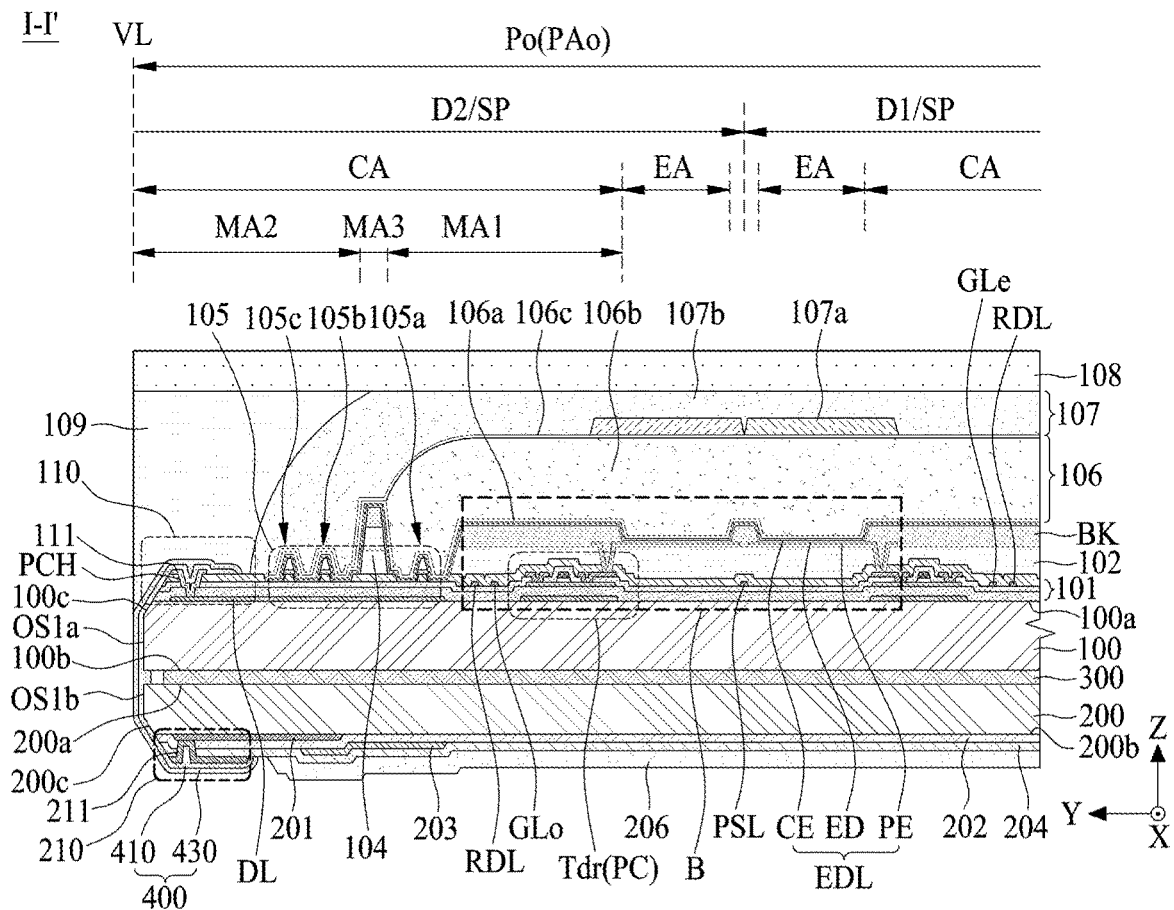
FIG. 8 is a cross-sectional view taken along line I-I' illustrated in FIG. 7.
Figure 9:
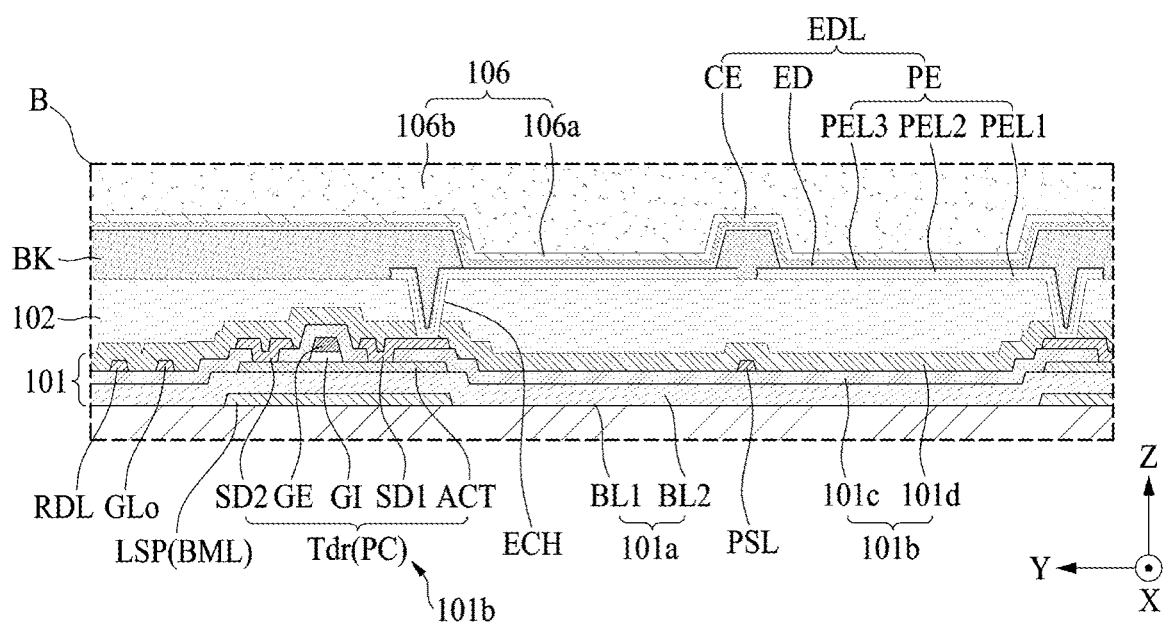
FIG. 9 is an enlarged view of a region 'B' illustrated in FIG. 8.
Figure 10:
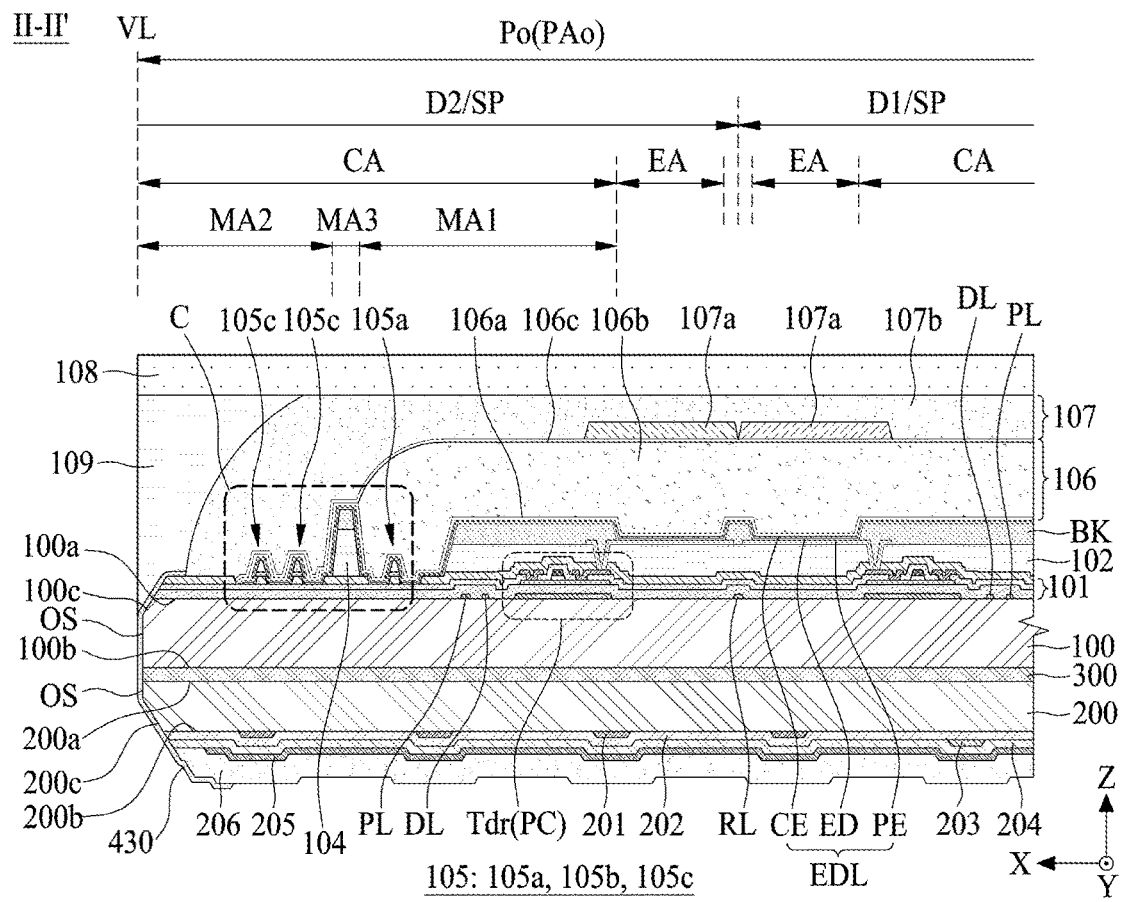
FIG. 10 is a cross-sectional view taken along line II-IP illustrated in FIG. 7.
Figure 11:
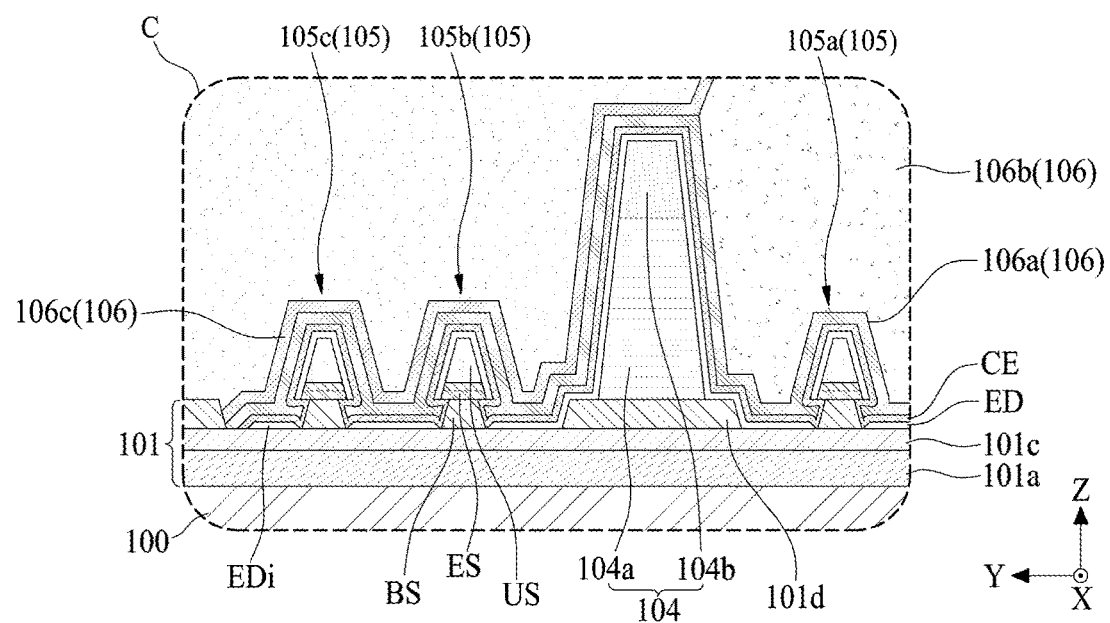
FIG. 11 is an enlarged view of a region 'C' illustrated in FIG. 10.

FIG. 8 is a cross-sectional view taken along line I-I' illustrated in FIG. 7, FIG. 9 is an enlarged view of a region 'B' illustrated in FIG. 8, FIG. 10 is a cross-sectional view taken along line II-IP illustrated in FIG. 7, and FIG. 11 is an enlarged view of a region 'C' illustrated in FIG. 10.

Referring to FIGS. 7, and 8 to 11, a light emitting display apparatus according to an embodiment of the present disclosure may include a first substrate 100, a second substrate 200, a coupling member 300, and a routing portion 400.

The first substrate 100 according to an embodiment of the present disclosure may include a circuit layer 101, a planarization layer 102, a light emitting device layer EDL, a bank BK, and a first pad part 110.

The circuit layer 101 may be disposed over the first substrate 100. The circuit layer 101 may be referred to as a pixel array layer or a TFT array layer.

The circuit layer 101 according to an embodiment of the present disclosure may include a buffer layer 101a and a circuit array layer 101b.

The buffer layer 101a may prevent materials, such as hydrogen included in the first substrate 100, from being diffused to the circuit array layer 101b in a high temperature process of a process of manufacturing a TFT. Also, the buffer layer 101a may prevent external water or moisture from penetrating into the light emitting device layer EDL. The buffer layer 101a according to an embodiment may include silicon oxide (SiOx), silicon nitride (SiNx), silicon oxynitride (SiON), or a multilayer thereof, but embodiments of the present disclosure are not limited thereto. For example, the buffer layer 101a may include a first buffer layer BL1 which includes SiNx and is disposed on the first substrate 100 and a second buffer layer BL2 which includes SiOx and is disposed on the first buffer layer BL1.

The circuit array layer 101b may include a pixel circuit PC which includes a driving TFT Tdr disposed in each of a plurality of pixel areas PA over the buffer layer 101a.

The driving TFT Tdr disposed in a circuit area of the each pixel area PA may include an active layer ACT, a gate insulation layer GI, a gate electrode GE, an interlayer insulation layer 101c, a first source/drain electrode SD1, a second source/drain electrode SD2, and a passivation layer 101d.

The active layer ACT may be disposed on the buffer layer 101a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may directly connect between lines in the display area AA. Also, the active layer ACT may be used as a bridge line of a jumping structure which electrically connects lines disposed on different layers.

The gate insulation layer GI may be disposed on the channel area of the active layer ACT. The gate insulation layer GI may insulate the active layer ACT from the gate electrode GE.

The gate electrode GE may be disposed on the gate insulation layer GI and connected to the gate line. The gate electrode GE may overlap the channel area of the active layer ACT with the gate insulation layer GI therebetween.

The interlayer insulation layer 101c may be disposed at the first substrate 100 to cover the gate electrode GE and the active layer ACT. The interlayer insulation layer 101c may electrically insulate (or isolate) the gate electrode GE and the source/drain electrodes SD1 and SD2. For example, the interlayer insulation layer 101c may be referred to as an insulation layer or a first insulation layer.

The first source/drain electrode SD1 may be disposed on the interlayer insulation layer 101c overlapping the first source/drain area of the active layer ACT and may be electrically connected to the first source/drain area of the active layer ACT through a first source/drain contact hole disposed in the interlayer insulation layer 101c. For example, the first source/drain electrode SD1 may be a source electrode of the driving TFT Tdr, and the first source/drain area of the active layer ACT may be a source area.

The second source/drain electrode SD2 may be disposed on the interlayer insulation layer 101c overlapping the second source/drain area of the active layer ACT and may be electrically connected to the second source/drain area of the active layer ACT through a second source/drain contact hole disposed in the interlayer insulation layer 101c. For example, the second source/drain electrode SD2 may be a drain electrode of the driving TFT Tdr, and the second source/drain area of the active layer ACT may be a drain area.

The passivation layer 101d may be disposed over the first substrate 100 to cover the pixel circuit PC including the driving TFT Tdr.

The passivation layer 101d according to an embodiment may be formed of an inorganic insulating material. For example, the passivation layer 101d may include a single-layer structure including one of silicon oxide (SiOx), silicon nitride (SiNx), silicon oxynitride (SiONx), titanium oxide (TiOx), and aluminum oxide (AlOx) or a stacked structure thereof. For example, the passivation layer 101d may be referred to as a protection layer, a circuit protection layer, a circuit insulation layer, an inorganic insulation layer, a first inorganic insulation layer, or a second insulation layer, or the like.

Each of first and second switching TFT Tsw1 and Tsw2 configuring the pixel circuit PC may be formed together with the driving TFT Tdr, and thus, their repetitive descriptions are omitted.

The circuit layer 101 according to an embodiment may further include a lower metal layer BML, which is disposed between the first substrate 100 and the buffer layer 101a.

The lower metal layer BML may further include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the first substrate 100 and the active layer ACT. The light blocking pattern LSP may block light which is incident on the active layer ACT through the first substrate 100, thereby preventing or minimizing a threshold voltage variation of each TFT caused by external light. Optionally, the light blocking pattern LSP may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

The lower metal layer BML may be used as a line disposed in parallel with each other of the gate line GL, the data line DL, the pixel driving power line PL, the pixel common voltage line CVL, and the reference voltage line RL. For example, the lower metal layer BML may be used as a metal layer (or a line) disposed in parallel to the second direction Y of the pixel driving lines DL, GL, PL, CVL, RL, and GCL disposed at the first substrate 100. Each of the lines that provide signals and/or a voltage to a pixel is consider a pixel driving line. This includes the lines DL, GL, PL, CVL, RL, and GCL.

The planarization layer 102 may be disposed over the first substrate 100 and may provide a flat surface over the circuit layer 101. The planarization layer 102 may cover the circuit layer 101 including the driving TFT Tdr disposed at each of the plurality of pixel areas PA.

The planarization layer 102 according to an embodiment may be disposed between the first substrate 100 and the light emitting device layer EDL or between the circuit layer 101 and the light emitting device layer EDL. The planarization layer 102 according to an embodiment may be formed of an organic insulating material, but embodiments of the present disclosure are not limited thereto. For example, the planarization layer 102 may be formed of an organic insulation material which includes acrylic resin, epoxy resin, phenolic resin, polyamide-based resin, polyimide-based resin, or the like, but embodiments of the present disclosure are not limited thereto.

The light emitting device layer EDL may be disposed over the planarization layer 102. The light emitting device layer EDL according to an embodiment may include a pixel electrode PE, a self-emitting device ED, and a common electrode CE.

The pixel electrode PE may be referred to as an anode electrode, a reflective electrode, a lower electrode, an anode, or a first electrode, of the self-emitting device ED.

The pixel electrode PE may be disposed over the planarization layer 102 overlapping an emission area EA of each of the plurality of subpixel SP in the first substrate 100. The pixel electrode PE may be patterned in an island shape and disposed in each subpixel SP, and may be electrically coupled to the first source/drain electrode SD1 of the driving TFT Tdr of a corresponding pixel circuit PC. For example, one side of the pixel electrode PE may extend onto the first source/drain electrode SD1 of the driving TFT Tdr and may be electrically coupled to the first source/drain electrode SD1 of the driving TFT Tdr through an electrode contact hole ECH provided in the planarization layer 102.

The pixel electrode PE may include a metal material which is low in work function and is good in reflective efficiency.

The pixel electrode PE according to an embodiment of the present disclosure may have a two-layer structure including a first pixel electrode layer (or a first metal layer) PEL1 and a second pixel electrode layer (or a second metal layer) PEL2. The first and second pixel electrode layers PEL1 and PEL2 may be sequentially deposited over the planarization layer 102 and then simultaneously patterned, but embodiments of the present disclosure are not limited thereto.

The first pixel electrode layer PEL1 may disposed over the planarization layer 102. The second pixel electrode layer PEL2 may disposed (or stacked) on the first pixel electrode layer PEL1. For example, the first pixel electrode layer PEL1 may act as an adhesive layer corresponding to the planarization layer 102 and may act as a secondary electrode of the self-emitting device ED, and moreover, may include indium tin oxide (ITO) or indium zinc oxide (IZO), but embodiments of the present disclosure are not limited thereto. For example, the second pixel electrode layer PEL2 may act as a reflector and may perform a function of decreasing a resistance of the pixel electrode PE, and moreover, may include one material of aluminum (Al), silver (Ag), molybdenum (Mo), titanium (Ti), and a Mo—Ti alloy (MoTi), but embodiments of the present disclosure are not limited thereto. For example, the pixel electrode PE according to an embodiment may be formed in a two-layer structure of ITO/MoTi or IZO/MoTi.

The pixel electrode PE according to another embodiment may have a three-layer structure including a first pixel electrode layer PEL1, a second pixel electrode layer PEL2 on the first pixel electrode layer PEL1, and a third pixel electrode layer (or a third metal layer) PEL3 on the second pixel electrode layer PEL2. For example, the third pixel electrode layer PEL3 may act as an electrode of the self-emitting device ED and may include ITO or IZO. For example, the pixel electrode PE according to another embodiment may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 on the first pixel electrode layer PEL1, a third pixel electrode layer (or a third metal layer) PEL3 on the second pixel electrode layer PEL2, and a fourth pixel electrode layer (or a fourth metal layer) on the third pixel electrode layer PEL3.

In the pixel electrode PE of the four-layer structure, the first pixel electrode layer may act as the adhesive layer corresponding to the planarization layer 102 and may act as the secondary electrode of the self-emitting device ED, and moreover, may include one or more material of ITO, Mo, and MoTi. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the self-emitting device ED and may include ITO or IZO. For example, the pixel electrode PE according to another embodiment may be formed in a four-layer structure of ITO/Cu/MoTi/ITO.

The pixel electrode PE according to another embodiment may have a five-layer structure including a first pixel electrode layer made of ITO, a second pixel electrode layer made of MoTi, a third pixel electrode layer made of ITO, a fourth pixel electrode layer made of Ag, and a fifth pixel electrode layer made of ITO.

The self-emitting device ED may be disposed over the first substrate 100. The self-emitting device ED may be formed over the pixel electrode PE and may directly contact the pixel electrode PE. The pixel electrode PE may be disposed under (or below) the self-emitting device ED. For example, the pixel electrode PE may be disposed between the planarization layer 102 and the self-emitting device ED.

The self-emitting device ED according to an embodiment may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). For example: the self-emitting device ED according to another embodiment may include an organic light emitting device, or may include a stacked or a combination structure of an organic light emitting device and a quantum dot light emitting device.

The organic light emitting device may include two or more organic light emitting parts for emitting white light (or blue light). For example, the organic light emitting device may include a first organic light emitting part and a second organic light emitting part for emitting white light based on a combination of first light and second light. For example, the first organic light emitting part may include at least one or more of a blue light emitting layer, a green light emitting layer, a red light emitting layer, a yellow light emitting layer, and a yellow-green light emitting layer. The second organic light emitting part may include at least one or more of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device according to an embodiment may further include at least one or more function layers for enhancing emission efficiency and/or lifetime. For example, the function layer may be disposed upper and/or under a light emitting layer.

The common electrode CE may be disposed over the display area AA of the first substrate 100 and may be electrically coupled to the self-emitting device ED of each of the plurality of pixels P. For example, the common electrode CE may be disposed over the remaining display area AA of the first substrate 100 except for the first pad part 110 of the first substrate 100.

The common electrode CE may be referred to as a cathode electrode, a transparent electrode, an upper electrode, a cathode, or a second electrode of the self-emitting device ED. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO2:Sb.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank BK may be disposed over the planarization layer 102 to define the pixel areas PA over the first substrate 100. The bank BK may be disposed over the planarization layer 102 to cover a periphery portion of the pixel electrode PE. The bank BK may define the emission area EA (or an opening portion) of each of the plurality of subpixels SP and may electrically isolate the pixel electrodes PE disposed in adjacent subpixels SP. The bank BK may be formed to cover the electrode contact hole ECH disposed in each of the plurality of pixel areas PA. The bank BK may be covered by the self-emitting device ED of the light emitting device layer EDL. For example, the self-emitting device ED may be disposed over the bank BK as well as over the pixel electrode PE of each of the plurality of subpixels SP.

The bank BK according to an embodiment may be a transparent bank including a transparent material or a black bank including a black pigment.

The first pad part 110 may be disposed at one periphery portion of the first substrate 100 and may be electrically coupled to the pixel driving lines DL, GL, PL, CVL, RL, and GCL in a one-to-one relationship.

The first pad part 110 according to an embodiment of the present disclosure may include a plurality of first pads 111.

The plurality of first pads 111 may be grouped (or classified) into first data pads DP, first gate pads GP, first pixel driving power pads PPP, first reference voltage pads RVP, and first pixel common voltage pads CVP.

Each of the plurality of first pads 111 may be electrically coupled to a corresponding line of the pixel driving lines DL, GL, PL, CVL, RL, and GCL through a pad contact hole PCH passing through the insulation layer, which in the embodiment shown in FIGS. 7 and 8, includes the combination of passivation layer 101d, the interlayer insulation layer 101c, and the buffer layer 101a. Each of the plurality of first pads 111 according to an embodiment may include the same material as the pixel electrode PE and may be formed together with the pixel electrode PE. According to another embodiment, each of the plurality of first pads 111 may include the same material as a source/drain electrode of a TFT and may be formed together along with the source/drain electrode of the TFT.

The light emitting display apparatus or the first substrate 100 according to an embodiment of the present disclosure may further include a first margin area MA1, a second margin area MA2, and a third margin area MA3.

The first margin area MA1 may be disposed between an emission area EA of the outermost pixel Po and the outer surface OS of the first substrate 100. The first margin area MA1 may be configured to have a first width between an end of the emission area EA (or the bank BK) of the outermost pixel Po and the outer surface OS of the first substrate 100 based on the reliability margin of the light emitting device layer EDL caused by lateral penetration of water (or moisture).

The second margin area MA2 may be configured to have a second width between the outer surface OS of the first substrate 100 and the first margin area MA1 based on the reliability margin of the light emitting device layer EDL caused by lateral penetration of water (or moisture). For example, the second margin area MA2 may be an area including the first pad part 110.

The third margin area MA3 may be disposed between the first margin area MA1 and the second margin area MA2.

With respect to the first direction X, a width of each of the first margin area MA1, the second margin area MA2, and third margin area MA3 may be implemented so that a second interval D2 between a center portion of the outermost pixel and the outer surface OS of the first substrate 100 is half or less of a pixel pitch (or a first interval D1) between two adjacent pixel areas PA.

The light emitting display apparatus or the first substrate 100 according to an embodiment of the present disclosure may further include a dam 104, an outer device isolation portion 105, and an encapsulation layer 106.

Referring to FIGS. 1, 8, 10, and 11, the dam 104 according to an embodiment of the present disclosure may be disposed at the periphery portion of the first substrate 100 or the periphery portion of an outermost pixel. For example, the outermost pixels disposed at the periphery portion of the first substrate 100 may include the dam 104, and thus may be implemented to have a structure which differs from an inner pixel.

The dam 104 may be disposed at the third margin area MA3 of the first substrate 100. For example, the dam 104 may be disposed in a closed loop line shape which surrounds the display area AA and may surround an end portion of the planarization layer 102.

The dam 104 may be disposed over the circuit layer 101 of the periphery portion of the first substrate 100 or the periphery portion of the outermost pixel. For example, the dam 104 may be disposed over the passivation layer 101d of the circuit layer 101 to have a closed loop line shape which surrounds the display area AA. The dam 104 may prevent the spread or overflow of the encapsulation layer 106 disposed over the first substrate 100 to cover the display area AA.

The dam 104 according to an embodiment may include the same material together with the planarization layer 102. The dam 104 may have the same height (or thickness) as the planarization layer 102, or may have a height which is higher than the planarization layer 102. For example, a height (or thickness) of the dam 104 may be twice a height (or thickness) of the planarization layer 102.

The dam 104 according to another embodiment may include a first dam pattern (or a lower dam) 104a which is formed of the same material together with the planarization layer 102, and a second dam pattern (or an upper dam) 104b which is stacked on the first dam pattern 104a and includes the same material as the bank BK. The first dam pattern 104a may have the same height (or thickness) as the planarization layer 102, or may have a height which is higher than the planarization layer 102. For example, a height (or thickness) of the first dam pattern 104a may be twice a height (or thickness) of the planarization layer 102.

According to another embodiment, the first dam pattern 104a may be formed or implemented by a portion (or a non-patterning region) of the planarization layer 102 which remains without being patterned (or removed) by a patterning process performed on the planarization layer 102 by using an etching process. And, the second dam pattern 104b may be formed or implemented by a portion (or a non-patterning region) of the bank BK which remains without being patterned (or removed) by a patterning process performed on the bank BK by using an etching process.

Referring to FIGS. 1, 8, 10, and 11, the outer device isolation portion 105 according to an embodiment of the present disclosure may be disposed at a periphery portion of the first substrate 100 or a periphery portion of an outermost pixel. For example, the outermost pixels disposed at the periphery portion of the first substrate 100 may include the outer device isolation portion 105, and thus may be implemented to have a structure which differs from an inner pixel. In the following description, the outer device isolation portion may be referred to as an outer isolation portion.

The outer isolation portion 105 may be implemented to isolate (or separate) the self-emitting device ED disposed at the second margin area MA2 of the first substrate 100. The outer isolation portion 105 may be implemented to prevent the penetration of water (or moisture) in a lateral direction of the first substrate 100 to prevent the self-emitting device ED from being degraded by the lateral penetration of water (or moisture). The outer isolation portion 105 may isolate (or separate) the self-emitting device ED of the light emitting device layer EDL at least once, at a position adjacent to or near the dam 104, and thus, may prevent the lateral penetration of water (or moisture).

The outer isolation portion 105 may be implemented over the interlayer insulation layer 101c in the first substrate 100 to surround the display area AA. For example, the outer isolation portion 105 may be implemented in a closed loop line shape over the interlayer insulation layer 101c to surround the display area AA in.

The outer isolation portion 105 according to an embodiment of the present disclosure may include a plurality of isolation structures 105a to 105c disposed over the interlayer insulation layer 101c in the outermost pixels. For example, the outer isolation portion 105 may include first to third isolation structures 105a, 105b, and 105c implemented in parallel to each other to have a closed loop line shape.

According to an embodiment, the first isolation structure 105a may be surrounded by the dam 104, the second and third isolation structures 105b and 105c may disposed in parallel to each other to surround the dam 104. For example, the dam 104 may be disposed between the first isolation structure 105a and the second isolation structure 105b.

Each of the first to third isolation structures 105a, 105b, and 105c according to an embodiment may include a lower structure BS, an eaves structure ES, and an upper structure US.

The lower structure BS may be implemented by the passivation layer 101d. The lower structure BS may be formed by a patterning process performed on the passivation layer 101d disposed at the outermost pixels. For example, the lower structure BS may be formed or implemented by a portion (or a non-patterning region) of the passivation layer 101*d* which remains without being patterned (or removed) by a patterning process performed on the passivation layer 101*d* by using an etching process.

A side surface of the lower structure BS according to an embodiment may be implemented in an inclined structure or a forward tapered structure. For example, a cross-sectional surface of the lower structure B S taken along a width direction may have a cross-sectional structure having a trapezoid shape where a top side is narrower than a lower side. Thus, the lower structure BS may be formed or implemented by a portion (or a non-patterning region) of the passivation layer 101*d* which remains without being patterned (or removed) by a patterning process performed on the passivation layer 101*d* by using an etching process.

The eaves structure ES may be disposed over the lower structure BS. The eaves structure ES may have at least two-layer structure which is the same as the pixel electrode PE. For example, the eaves structure ES may include a first metal layer which is formed together with a first pixel electrode layer PEL1 of a pixel electrode PE and directly contacts the top surface of the lower structure BS, and a second metal layer which is formed together with a second pixel electrode layer PEL2 of the pixel electrode PE and is disposed (or stacked) over the first metal layer. For example, in the eaves structure ES, the first metal layer may be made of an ITO material, and the second metal layer may be made of a Mo—Ti alloy (MoTi) material, but is not limited thereto.

According to an embodiment, the eaves structure ES may be formed or implemented by a portion (or a non-patterning region) of the pixel electrode PE which remains without being patterned (or removed) by a patterning process performed on the pixel electrode PE by using an etching process.

The eaves structure ES may have a width which is wider than the top surface of the lower structure BS. A lateral surface of the eaves structure ES may be implemented in an inclined structure or a forward tapered structure. For example, a cross-sectional surface of the eaves structure ES taken along a width direction may have a cross-sectional structure having the same trapezoid shape as the lower structure BS. With respect to the width direction, each of one side of the periphery portion and the other side of the periphery portion of the eaves structure ES may protrude to the outside of the side surface of the lower structure BS.

The lateral surface of the lower structure BS may have an undercut structure with respect to the eaves structure ES. For example, a boundary portion between the lower structure BS and the eaves structure ES or an upper lateral surface of the lower structure BS may have an undercut structure with respect to the eaves structure ES. Accordingly, the eaves structure ES may have an eaves structure with respect to the lower structure BS. According to an embodiment, the undercut structure between the lower structure BS and the eaves structure ES may be formed or implemented by an over-etching process of the passivation layer 101*d*.

The upper structure US may be disposed over the eaves structure ES. A lower surface of the upper structure US may have the same width as a top surface of the eaves structure ES. In the upper structure US, the top surface may have the same width as the lower surface or may have a narrower width. For example, a lateral surface of the upper structure US may be implemented in an inclined structure or a forward tapered structure.

The upper structure US according to an embodiment may include an organic insulating material or an inorganic insulating material. For example, the upper structure US may be stacked on the eaves structure ES with the same material as the bank BK. The upper structure US may be formed or implemented by a portion (or a non-patterning region) of the bank BK which remains without being patterned (or removed) by a patterning process performed over the bank BK. The upper structure US may prevents the eaves structure ES from being etched.

As described above, the outer isolation portion 105 including the first to third isolation structures 105*a*, 105*b*, and 105*c* may isolate (or separate) the self-emitting device ED, or may isolate (or separate) the self-emitting device ED and the common electrode CE. For example, the self-emitting device ED formed (or deposited) over the outer isolation portion 105 may be automatically isolated (or separated) in performing a deposition process by the undercut structure (or the eaves structure) of each of the first to third isolation structures 105*a*, 105*b*, and 105*c*, without a separate isolation process. Accordingly, the self-emitting device ED may include an isolation region isolated by the outer isolation portion 105.

According to an embodiment of the present disclosure, a deposition material of the self-emitting device ED made of the organic light emitting device may have linearity, and thus, may not be deposited over the side surface of the lower structure BS covered by the eaves structure ES based on the eaves structure of each of the first to third isolation structures 105*a*, 105*b*, and 105*c*. Therefore, the self-emitting device ED formed (or deposited) over the outer isolation portion 105 may be isolated (or separated) between the lower structure BS and the eaves structure ES of each of the first to third isolation structures 105*a*, 105*b*, and 105*c*. Thus, the self-emitting device ED may be automatically isolated (or separated) by the first to third isolation structures 105*a*, 105*b*, and 105*c* of the outer isolation portion 105 in performing a deposition process, and thus, a separate patterning process of isolating (or separating) the self-emitting device ED may be omitted. Accordingly, the self-emitting device ED disposed over the first substrate 100 may be isolated (or separated) at a periphery portion of the first substrate 100 by the outer isolation portion 105, and thus, a lateral water penetration path of the first substrate 100 may be blocked by the first to third isolation structures 105*a*, 105*b*, and 105*c* of the outer isolation portion 105.

Optionally, the common electrode CE disposed over the self-emitting device ED may be automatically isolated (or separated) by the first to third isolation structures 105*a*, 105*b*, and 105*c* of the outer isolation portion 105 in performing a deposition process based on deposition, or may be formed to surround all of the isolated island-shaped self-emitting devices ED and the first to third isolation structures 105*a*, 105*b*, and 105*c* of the outer isolation portion 105 in performing a deposition process based on deposition.

Additionally, as illustrated in FIG. 11, an eaves structure ES including a metal material disposed in at least one of the first to third isolation structures 105*a* to 105*c* of the outer isolation portion 105 may be electrically connected to at least one pixel common voltage line CVL through a via hole VH formed in the lower structure BS. For example, the via hole VH may be formed to sequentially pass through the lower structure BS, the interlayer insulation layer 101*c*, and the buffer layer 101*a* which are disposed at an intersection portion between the pixel common voltage line CVL and the eaves structure ES having a closed loop line shape. Therefore, the eaves structure ES disposed in at least one of the first to third isolation structures 105*a* to 105*c* may be electrically connected to the at least one pixel common voltage line CVL through a corresponding via hole VH.

Accordingly, the eaves structure ES may form an equivalent potential along with the plurality of pixel common voltage lines CVL and may primarily block static electricity flowing from the outside to an inner portion of the display area AA to prevent a defect caused by static electricity. For example, the eaves structure ES disposed in at least one of the first to third isolation structures 105a to 105c may discharge static electricity, flowing in from the outside, to the pixel common voltage line CVL to prevent a defect caused by static electricity.

Referring to FIGS. 8 to 11, the encapsulation layer 106 according to an embodiment of the present disclosure may be disposed over a remaining portion, other than an outermost periphery portion including the first pad part 110, of the first substrate 100 and may be implemented to cover the light emitting device layer EDL. For example, the encapsulation layer 106 may be implemented to surround all of the front surface and lateral surfaces of the light emitting device layer EDL, and thus, may prevent oxygen or water (or moisture) from penetrating into the light emitting device layer EDL, thereby improving the reliability of the light emitting device layer EDL.

The encapsulation layer 106 according to an embodiment of the present disclosure may include first to third encapsulation layers 106a to 106c.

The first encapsulation layer 106a may be implemented to prevent oxygen or water from penetrating into the light emitting device layer EDL. The first encapsulation layer 106a may be disposed over the common electrode CE and may surround the light emitting device layer EDL. Therefore, all of a front surface and lateral surfaces of the light emitting device layer EDL may be surrounded by the first encapsulation layer 106a. The first encapsulation layer 106a according to an embodiment may include an inorganic insulating material.

When the self-emitting device ED and the common electrode CE are isolated by the outer isolation portion 105, the first encapsulation layer 106a may surround an isolation surface (or a separation surface) of the self-emitting device ED and the common electrode CE isolated by the outer isolation portion 105. For example, the first encapsulation layer 106a may be filled (or buried) into an isolation space of the self-emitting device ED and the common electrode CE formed by an isolation structure (or an undercut structure) of the outer isolation portion 105 to seal or fully surround the outer isolation portion 105, and thus, may fully surround or cover each of the isolated self-emitting device ED and common electrode CE, thereby fundamentally (or completely) preventing the lateral penetration of water (or moisture).

The second encapsulation layer 106b may be implemented on the first encapsulation layer 106a disposed at an encapsulation region defined by the dam 104 to have a thickness which is relatively thicker than the first encapsulation layer 106a. The second encapsulation layer 106b may have a thickness for fully cover particles (or an undesired material or an undesired structure element) which is or may be on the first encapsulation layer 106a. The second encapsulation layer 106b may spread to the periphery portion of the first substrate 100 due to a relatively thick thickness, but the spread of the second encapsulation layer 106b may be blocked by the dam 104.

The second encapsulation layer 106b according to an embodiment of the present disclosure may include an organic insulating material or a liquid organic insulating material. For example, the second encapsulation layer 106b may include an organic insulating material such as SiOCz acrylic or epoxy-based resin. The second encapsulation layer 106b may be referred to as a particle cover layer, an organic encapsulation layer, or the like.

The third encapsulation layer 106c may be implemented to primarily prevent oxygen or water from penetrating into the light emitting device layer EDL. The third encapsulation layer 106c may be implemented to surround all of the second encapsulation layer 106b disposed inside from the dam 104 and the first encapsulation layer 106a disposed outside from the dam 104. The third encapsulation layer 106c according to an embodiment may include an inorganic insulating material which is the same as or different from the first encapsulation layer 106a.

Referring again to FIGS. 8 and 10, the light emitting display apparatus or the first substrate 100 according to an embodiment of the present disclosure may further include a wavelength conversion layer 107 disposed over the encapsulation layer 106.

The wavelength conversion layer 107 may convert a wavelength of light which is incident thereon from an emission area of each pixel area PA. For example, the wavelength conversion layer 107 may convert white light (or blue light), which is incident thereon from the emission area, into color light corresponding to the subpixel SP or may transmit only color light corresponding to the subpixel SP. For example, the wavelength conversion layer 107 may include at least one of a wavelength conversion member and a color filter layer.

The wavelength conversion layer 107 according to an embodiment may include a plurality of wavelength conversion members 107a and a protection layer 107b.

The plurality of wavelength conversion members 107a may be disposed over the encapsulation layer 106 disposed at the emission area EA of each of the plurality of subpixel SP. For example, each of the plurality of wavelength conversion members 107a may be implemented to have the same size as or wider than the emission area EA of each subpixel area.

The plurality of wavelength conversion members 107a according to an embodiment may be grouped (or classified) into a red light filter which converts white light into red light, a green light filter which converts white light into green light, and a blue light filter which converts white light into blue light. For example, the red light filter (or a first light filter) may be disposed over the encapsulation layer 106 in the emission area EA of the red subpixel SP, the green light filter (or a second light filter) may be disposed over the encapsulation layer 106 in the emission area EA of the green subpixel SP, and the blue light filter (or a third light filter) may be disposed over the encapsulation layer 106 in the emission area EA of the blue subpixel SP.

The plurality of wavelength conversion members 107a according to another embodiment may be disposed over the encapsulation layer 106 of each subpixel area. For example, each of the plurality of wavelength conversion members 107a may be disposed over the encapsulation layer 106 to overlap the entire corresponding subpixel SP.

The plurality of wavelength conversion members 107a according to another embodiment may be implemented to overlap each other at the encapsulation layer 106 overlapped with the circuit area CA (or the non-emission area) except for the emission area EA of each subpixel SP. For example, two or more wavelength conversion members 107a having different colors are disposed at the encapsulation layer 106 overlapping the circuit area CA (or non-emission area) except for the emission area EA of each subpixel SP. The two or more wavelength conversion members 107a disposed at the encapsulation layer 106 overlapping the circuit area CA (or non-emission area) may act as a light blocking pattern which prevents color mixture between adjacent subpixels SP or between adjacent pixels P.

The protection layer 107b may be implemented to cover the wavelength conversion members 107a and to provide a flat surface over the wavelength conversion members 107a. The protection layer 107b may be disposed to cover the wavelength conversion members 107a and the encapsulation layer 106 where the wavelength conversion members 107a are not disposed. The protection layer 107b according to an embodiment may include an organic insulating material. Alternatively, the protection layer 107b may further include a getter material for adsorbing water and/or oxygen.

Optionally, the wavelength conversion layer 107 according to another embodiment may include two or more layers of wavelength conversion members 107a disposed over the encapsulation layer 106 overlapping the circuit area CA (or non-emission area) except for the emission area EA in each subpixel SP. The two or more layers of wavelength conversion members 107a may act as the light blocking pattern.

Alternatively, the wavelength conversion layer 107 may be changed to a wavelength conversion sheet having a sheet form and may be disposed over the encapsulation layer 106. In this case, the wavelength conversion sheet (or a quantum dot sheet) may include the wavelength conversion members 107a disposed between a pair of films. For example, when the wavelength conversion layer 107 includes a quantum dot which re-emits colored light set in a subpixel SP, the light emitting device layer EDL of a subpixel SP may be implemented to emit white light or blue light.

Referring to FIGS. 8 and 10, the light emitting display apparatus or the first substrate 100 according to an embodiment of the present disclosure may further include a functional film 108.

The functional film 108 may be disposed over the wavelength conversion layer 107. For example, the functional film 108 may be coupled to over the wavelength conversion layer 107 by a transparent adhesive member. The functional film 108 according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 100, from traveling to the outside.

The barrier layer may include a material (for example, a polymer material) which is low in water transmission rate, and may primarily prevent the penetration of water or oxygen.

The touch sensing layer may include a touch electrode layer based on a mutual capacitance method or a self-capacitance method, and may output touch data corresponding to a user's touch through the touch electrode layer.

The light path control layer may include a stacked structure where a high refraction layer and a low refraction layer are alternately stacked and may change a path of light incident from each pixel P to minimize a color shift based on a viewing angle.

Referring to FIGS. 8 and 10, the light emitting display apparatus or the first substrate 100 according to an embodiment of the present disclosure may further include a side sealing member 109.

The side sealing member 109 may be formed between the first substrate 100 and the functional film 108 and may cover all of lateral surfaces of the circuit layer 101 and the wavelength conversion layer 107. For example, the side sealing member 109 may cover all of lateral surfaces of each of the circuit layer 101 and the wavelength conversion layer 107 exposed at the outside of the display apparatus, between the functional film 108 and the first substrate 100. Also, the side sealing member 109 may cover a portion of the routing portion 400 coupled to the first pad part 110 of the first substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the first pad part 110 of the first substrate 100 may prevent or minimize the reflection of external light caused by the first pads 111 disposed in the first pad part 110.

Optionally, the side sealing member 109 may further include a getter material for adsorbing water and/or oxygen.

The display apparatus or the first substrate 100 according to an embodiment of the present disclosure may further include a first chamfer 100c which is provided at a corner portion between the first surface 100a and the outer surface OS. The first chamfer 100c may reduce or minimize the damage of the corner portion of the first substrate 100 caused by a physical impact applied from the outside and may prevent a disconnection of the routing portion 400 caused by the corner portion of the first substrate 100. For example, the first chamfer 100c may have a 45-degree angle, but embodiments of the present disclosure are not limited thereto. The first chamfer 100c may be implemented by a chamfer process using a cutting wheel, a polishing wheel, a laser, or the like. Accordingly, each of outer surfaces of the first pads 111 of the first pad part 110 disposed to contact the first chamfer 100c may include an inclined surface which is inclined by an angle corresponding to an angle of the first chamfer 100c by removing or polishing a corresponding portion thereof along with the corner portion of the first substrate 100 through the chamfer process. For example, when the first chamfer 100c is formed at an angle of 45 degrees between the outer surface OS and the first surface 100a of the first substrate 100, the outer surfaces (or one ends) of the first pads 111 of the first pad part 110 may be formed at an angle of 45 degrees.

Referring to FIGS. 7, 8, and 10, the second substrate 200 according to an embodiment of the present disclosure may include a second pad part 210, at least one third pad part 230, and a link line portion 250, as described with reference to FIG. 7, and thus, their repetitive descriptions are omitted or may be brief.

The second substrate 200 according to an embodiment may include a metal pattern layer and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over a rear surface 200b of a second substrate 200. The first metal layer 201 according to an embodiment may include a first metal pattern. For example, the first metal layer 201 may be referred to as a first link layer or a link line layer.

The first metal pattern according to an embodiment may have a two-layer structure (Cu/MoTi) of Cu and MoTi. The first metal pattern may be used as a link line of the link line part 250, and thus, its repetitive descriptions may be omitted.

The first insulation layer 202 may be implemented over the rear surface 200b of the second substrate 200 to cover the first metal layer 201. The first insulation layer 202 according to an embodiment may include an inorganic insulating material.

The second metal layer 203 may be implemented over the first insulation layer 202. The second metal layer 203 according to an embodiment may include a second metal pattern. For example, the second metal layer 203 may be referred to as a second link layer, a jumping line layer, or a bridge line layer.

The second metal pattern according to an embodiment may have a two-layer structure (Cu/MoTi) of Cu and MoTi. The second metal pattern may be used as a plurality of gate link lines of a plurality of link lines in the link line part 250, but embodiments of the present disclosure are not limited thereto. For example, the second metal layer 203 may be used as a jumping line (or a bridge line) for electrically connecting the link lines which are formed of different metal materials on different layers in the link line part 250.

Optionally, a link line (for example, a plurality of first link lines) disposed at the second metal layer 203 may be modified to be disposed at the first metal layer 201, and a link line (for example, a plurality of second link lines) disposed at the first metal layer 201 may be modified to be disposed at the second metal layer 203.

The second insulation layer 204 may be implemented over the rear surface 200b of the second substrate 200 to cover the second metal layer 203. The second insulation layer 204 according to an embodiment may include an inorganic insulating material.

The third metal layer 205 may be implemented over the second insulation layer 204. The third metal layer 205 according to an embodiment may include a third metal pattern. For example, the third metal layer 205 may be referred to as a third link layer or a pad electrode layer.

The third metal pattern according to an embodiment may have a stacked structure of at least two materials of ITO (or IZO), Mo, Ti, and MoTi. For example, the third metal pattern may have a three-layer structure of any one of ITO/Mo/ITO, ITO/MoTi/ITO, IZO/Mo/ITO, or IZO/MoTi/ITO. The third metal pattern may be used as pads 211 of the second pad part 210. For example, the pads 211 of the second pad part 210 formed of the third metal layer 205 may be electrically coupled to the first metal layer 201 through the pad contact holes formed at the first and second insulation layers 202 and 204.

The third insulation layer 206 may be implemented over the rear surface 200b of the second substrate 200 to cover the third metal layer 205. The third insulation layer 206 according to an embodiment may include an organic insulating material. For example, the third insulation layer 206 may include an insulating material such as photo acrylic or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

Each of the plurality of second pads 211 disposed at the second pad part 210 may be electrically coupled to a link line of a link line part 250 made of the first metal layer 201 or the second metal layer 203 disposed at the rear surface 200b of the second substrate 200, through a second pad contact hole disposed at the first and second insulation layers 202 and 204. For example, the second data pad may be electrically coupled to one end of a data link line through the second pad contact hole disposed at the first and second insulation layers 202 and 204.

Referring to FIGS. 7, 8, and 10, the coupling member 300 according to an embodiment of the present disclosure may be disposed between the first substrate 100 and the second substrate 200. The first substrate 100 and the second substrate 200 may be opposite-bonded to each other by the coupling member 300. The coupling member 300 according to an embodiment may be a transparent adhesive member or a double-sided tape including an optically clear adhesive (OCA), an optically clear resin (OCR), or a pressure sensitive adhesive (PSA). The coupling member 300 according to another embodiment may include a glass fiber.

The coupling member 300 according to an embodiment may be disposed at a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Referring to FIGS. 7, 8, and 10, the routing portion 400 according to an embodiment of the present disclosure may include the plurality of routing lines 410 electrically coupling the first pad part 110 and the second pad part 210 in one-to-one relationship. This is as described with reference to FIG. 7, and thus, its repeated description is omitted.

The light emitting display apparatus or the routing portion 400 according to an embodiment of the present disclosure may further include an edge coating layer 430.

The edge coating layer 430 may be implemented to cover the routing portion 400. The edge coating layer 430 may be implemented to cover the plurality of routing lines 410. For example, the edge coating layer 430 may be an edge protection layer or an edge insulation layer.

The edge coating layer 430 according to an embodiment may be implemented to cover all of the first periphery portion and the first outer surface OS1a of the first substrate 100 and the first periphery portion and the first outer surface OS1b of the second substrate 200 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize the reflection of external light caused by the plurality of routing lines 410 and the first pads 111 of the first pad part 110. As an embodiment, the edge coating layer 430 may include a light blocking material including black ink. As another embodiment, the edge coating layer 430 may implements (or configures) the outermost surface (or sidewall) of the display apparatus (or the display panel), and thus, may include an impact absorbing material (or substance) or a ductile material so as to prevent the damage of an outer surface OS of each of the first and second substrates 100 and 200. As another embodiment, the edge coating layer 430 may include a mixed material of a light blocking material and an impact absorbing material.

According to an embodiment, the edge coating layer 430 may be formed to surround one outer surface OS of each of the first and second substrates 100 and 200 on which the routing portion 400 is disposed.

According to another embodiment, as illustrated in FIGS. 7, 8, and 10, the edge coating layer 430 may be formed to surround all of the other outer surfaces OS as well as the one outer surface OS of each of the first and second substrates 100 and 200 on which the routing portion 400 is disposed. For example, the edge coating layer 430 may be formed to surround all outer surfaces OS of each of the first and second substrates 100 and 200. In this case, the one outer surface OS (or a first outer surface) of each of the first and second substrates 100 and 200 may be surrounded by the plurality of routing lines 410 and the edge coating layer 430. The other outer surfaces OS (or second to fourth outer surfaces), except the one outer surface OS, of each of the first and second substrates 100 and 200 may be surrounded by only the edge coating layer 430. For example, the first outer surface of each of the first and second substrates 100 and 200 may include the plurality of routing lines 410 and the edge coating layer 430, and the second to fourth outer surfaces, except the first outer surface, of each of the first and second substrates 100 and 200 may include only the edge coating layer 430.

According to an embodiment, when the plurality of routing lines 410 and the edge coating layer 430 disposed at the first outer surface are referred to as a first sidewall structure, and the edge coating layer 430 disposed at the second to fourth outer surfaces are referred to as a second sidewall structure, the first sidewall structure and the second sidewall structure may have different thicknesses (or widths). For example, a thickness (or a width) of the second sidewall structure may be thinner or narrower than a thickness (or a width) of the first sidewall structure by a thickness of the plurality of routing lines 410.

FIG. 12 is an enlarged view of a region D illustrated in FIG. 3, and FIG. 13 is a cross-sectional view taken along line illustrated in FIG. 12. The drawings are diagrams for describing a common electrode connection portion, a secondary line connection portion, and an inner isolation portion illustrated in FIG. 3. In describing FIGS. 12 and 13, repeated descriptions of elements which are the same as or correspond to the elements of FIG. 7 are omitted or will be briefly given below.

Referring to FIGS. 3, 8, 12, and 13, each of a plurality of common electrode connection portions CECP according to an embodiment of the present disclosure may be disposed at a first electrode connection area ECA1 between a plurality of pixels P overlapping each of a plurality of pixel common voltage lines CVL and may electrically connect a common electrode CE to each of the plurality of pixel common voltage lines CVL.

Each of the plurality of common electrode connection portions CECP may include a first electrode connection pattern ECP1, a groove GRV, a second electrode connection pattern ECP2, and a connection trench CT.

The first electrode connection pattern ECP1 may be disposed in a circuit layer 101 disposed at the first electrode connection area ECA1 between the plurality of pixels P and may be electrically connected to each of the plurality of pixel common voltage lines CVL through a first via hole VH1, with respect to a first direction X.

The first electrode connection pattern ECP1 according to an embodiment of the present disclosure may be disposed over the interlayer insulation layer 101c of the circuit layer 101 to extend long along the first direction X and to intersect with a corresponding pixel common voltage line CVL. A first via hole VH1 may be formed at the interlayer insulation layer 101c disposed in an overlap region between the first electrode connection pattern ECP1 and the pixel common voltage line CVL. The first electrode connection pattern ECP1 may be covered by the passivation layer 101d.

The first electrode connection pattern ECP1 according to an embodiment may be formed along with a source/drain electrode of a thin film transistor (TFT) disposed in a pixel. According to another embodiment, the first electrode connection pattern ECP1 may include a metal line layer, directly connected to the pixel common voltage line CVL through the first via hole VH1, and a cover metal layer which covers only a portion of the metal line layer. The cover metal layer (or a clad layer) may prevent the corrosion of the metal line layer.

The groove GRV may be formed so that a top surface of the circuit layer 101 disposed in the first electrode connection area ECA1 is exposed. The groove GRV may expose the passivation layer 101d of the circuit layer 101 disposed in the first electrode connection area ECA1. For example, the groove GRV may be formed by a patterning process performed on the planarization layer 102, disposed in the first electrode connection area ECA1, of the planarization layer 102 covering the circuit layer 101.

The second electrode connection pattern ECP2 may be disposed in the groove GRV and adjacent to or near the groove GRV so as to be electrically connected to the first electrode connection pattern ECP1.

The second electrode connection pattern ECP2 according to an embodiment may be disposed on the planarization layer 102 on the pixel common voltage line CVL and the passivation layer 101d exposed at the first electrode connection area ECA1 and may be electrically connected to the first electrode connection pattern ECP1 through a second via hole VH2 formed at the passivation layer 101d over the first electrode connection pattern ECP1.

The second electrode connection pattern ECP2 according to an embodiment may be formed along with the pixel electrode PE disposed in a pixel.

According to another embodiment, the second electrode connection pattern ECP2 may include only a metal material which is not damaged or corroded by a patterning process or a trench process of forming the connection trench CT. For example, the second electrode connection pattern ECP2 may include a first metal line pattern MLP1, directly connected to the first electrode connection pattern ECP1 through the second via hole VH2, and a second metal line pattern MLP2 stacked on the first metal line pattern MLP1. For example, the first metal line pattern MLP1 may include indium tin oxide (ITO), and the second metal line pattern MLP2 may include a molybdenum titanium alloy (MoTi). For example, the pixel electrode PE may be implemented in a five-layer structure which includes a first pixel electrode layer including ITO, a second pixel electrode layer including MoTi, a third pixel electrode layer including ITO, a fourth pixel electrode layer including silver (Ag), and a fifth pixel electrode layer including ITO, and in this case, the second electrode connection pattern ECP2 may include only the first and second pixel electrode layers other than the third to fifth pixel electrode layers among the first to fifth pixel electrode layers of the pixel electrode PE.

The connection trench CT may be formed by a patterning process performed on the passivation layer 101d covering a periphery portion of the first electrode connection pattern ECP1. For example, the connection trench CT may be formed by the patterning process performed on the passivation layer 101d after a patterning process performed on the pixel electrode PE and the second electrode connection pattern ECP2. That is, the connection trench CT may be formed by the same patterning process along with a lower structure of the outer isolation portion 105 formed or disposed in an outermost pixel, and thus, its repeated description is omitted or will be briefly given below.

The connection trench CT according to an embodiment may be formed to expose the passivation layer 101d covering a periphery portion of the first electrode connection pattern ECP1. The connection trench CT may be defined by a lateral surface of the passivation layer 101d disposed between an end of the second electrode connection pattern ECP2 and the periphery portion of the first electrode connection pattern ECP1. For example, the connection trench CT may have an inclined structure or a forward tapered structure, but is not limited thereto. Therefore, the connection trench CT may be an undercut area between the end of the second electrode connection pattern ECP2 and the periphery portion of the first electrode connection pattern ECP1. The undercut area between the end of the second electrode connection pattern ECP2 and the periphery portion of the first electrode connection pattern ECP1 may be formed or implemented by an over-etching process which uses the second electrode connection pattern ECP2 as a mask and is performed on the passivation layer 101d.

The second electrode connection pattern ECP2 may protrude to the outside of a lateral surface of the connection trench CT and may overlap or directly face a periphery portion of the first electrode connection pattern ECP1. The second electrode connection pattern ECP2 may include a protrusion tip PT which protrudes to the outside of the lateral surface of the connection trench CT and faces the first electrode connection pattern ECP1. Therefore, an end portion (or a protrusion tip PT) of each of the first metal line pattern MLP1 and the second metal line pattern MLP2 of the second electrode connection pattern ECP2 may have an eaves structure with respect to the connection trench CT. For example, the protrusion tip PT of the second electrode connection pattern ECP2 may be an eaves structure with respect to the connection trench CT. For example, the protrusion tip PT of the second electrode connection pattern ECP2 may be formed or implemented by the over-etching process which uses the second electrode connection pattern ECP2 as a mask and is performed on the passivation layer 101d. For example, the protrusion tip PT of the second electrode connection pattern ECP2 may be referred to as a first protrusion tip.

The second electrode connection pattern ECP2 may be electrically and directly connected to the common electrode CE based on a side contact manner. For example, in a case where the self-emitting device ED is formed by a deposition process, a deposition material of the self-emitting device ED may have linearity, and thus, may be deposited on a top surface (or an upper surface) of the second electrode connection pattern ECP2 but may not be deposited on a lateral surface and a bottom surface (or a lower surface) of the second electrode connection pattern ECP2. Accordingly, the lateral surface and the bottom surface of the second electrode connection pattern ECP2 may not be covered by the self-emitting device ED and may be exposed at the outside. For example, a lateral surface of the first metal line pattern MLP1 and a lateral surface and a bottom surface of the second metal line pattern MLP2 in the second electrode connection pattern ECP2 may not be covered by the self-emitting device ED and may be exposed at the outside.

The second electrode connection pattern ECP2 may isolate (or disconnect) the self-emitting device ED disposed in the first electrode connection area ECA1. For example, the deposition material of the self-emitting device ED may not be deposited over the lateral surface of the connection trench CT covered by the protrusion tip PT of the second electrode connection pattern ECP2, and thus, may be isolated (or disconnected) in an undercut area based on the connection trench CT. Also, the deposition material of the self-emitting device ED deposited over the periphery portion of the first electrode connection pattern ECP1 may be covered by the protrusion tip PT of the second electrode connection pattern ECP2, and thus, may be spaced apart from the lateral surface of the connection trench CT. Accordingly, a portion of the first electrode connection pattern ECP1 which overlaps or is covered by the protrusion tip PT of the second electrode connection pattern ECP2 may not be covered by the deposition material of the self-emitting device ED and may be exposed.

The common electrode CE may be formed on a top surface of the self-emitting device ED and may also be deposited over the lateral surface and the bottom surface of the second electrode connection pattern ECP2, and thus, may be electrically and directly connected to the second electrode connection pattern ECP2 based on the side contact manner. For example, the common electrode CE may be formed through a physical deposition process or a chemical deposition process, and in this case, a common electrode material may be deposited over the self-emitting device ED, and moreover, may pass through the undercut area based on the connection trench CT and may be deposited over the lateral surface and the bottom surface of the second electrode connection pattern ECP2. Therefore, the common electrode CE may be electrically and directly connected to the lateral surface of the first metal line pattern MLP1 and the lateral surface and the bottom surface of the second metal line pattern MLP2 in the second electrode connection pattern ECP2, and thus, may be electrically connected to the pixel common voltage line CVL through the second electrode connection pattern ECP2 and the first electrode connection pattern ECP1. Accordingly, the common electrode CE may be electrically connected to the pixel common voltage line CVL through the common electrode connection portion CECP even without a process of forming a separate contact hole or a separate contact structure material.

The common electrode CE may be formed to be continued without being isolated or disconnected at the undercut area based on the connection trench CT, and thus, may be formed to wholly surround the self-emitting device ED. The common electrode CE according to an embodiment may be inserted into the undercut area based on the connection trench CT and may cover the lateral surface of the connection trench CT, a portion of the first electrode connection pattern ECP1 covered and exposed by the protrusion tip PT of the second electrode connection pattern ECP2, and the self-emitting device ED isolated at the first electrode connection pattern ECP1. Therefore, the common electrode CE may be electrically and directly connected to a portion of the first electrode connection pattern ECP1 at an undercut area between the protrusion portion PT of the second electrode connection pattern ECP2 and the first electrode connection pattern ECP1. Accordingly, the common electrode CE may be electrically and directly connected to the protrusion tip PT of the second electrode connection pattern ECP2 and may also be directly connected to the first electrode connection pattern ECP1, and thus, an electrical contact area between the common electrode CE and the common electrode connection portion CECP may increase.

Each of the plurality of common electrode connection portions CECP may be covered and planarized by the encapsulation layer 106. For example, a first encapsulation layer 106a of the encapsulation layer 106 may be disposed over the common electrode CE to surround or cover the common electrode CE. A second encapsulation layer 106b of the encapsulation layer 106 may be disposed over the first encapsulation layer 106a and may provide a flat surface over the first encapsulation layer 106a. Accordingly, a region overlapping the groove GRV formed at each of the plurality of common electrode connection portions CECP may be planarized by the second encapsulation layer 106b. The second encapsulation layer 106b may be covered by a third encapsulation layer 106c of the encapsulation layer 106.

Each of the plurality of secondary line connection portions SLCP according to an embodiment of the present disclosure may be disposed in the second electrode connection area ECA2 between a plurality of pixels P overlapping each of the plurality of secondary voltage lines SVL and may electrically connect the common electrode CE to the plurality of secondary voltage lines SVL.

Each of the plurality of secondary line connection portions SLCP may include the first electrode connection pattern ECP1, the groove GRV, the second electrode connection pattern ECP2, and the connection trench CT. Except for that each of the plurality of secondary line connection portions SLCP electrically connects the common electrode CE to each of the plurality of secondary voltage lines SVL at the second electrode connection area ECA2 parallel to the first electrode connection area ECA1, each of the plurality of secondary line connection portions SLCP may be substantially the same as each of the plurality of common electrode connection portions CECP, and thus, like reference numerals refer to like elements and their repeated descriptions are omitted.

In the light emitting display apparatus according to an embodiment of the present disclosure, each of the pixel common voltage lines CVL disposed at each pixel P of the display area AA may be electrically connected to the common electrode CE through the common electrode connection portion CECP and the secondary line connection portion SLCP in each pixel P, and thus, a pixel common voltage applied to each pixel P may be uniform, thereby preventing or minimizing a reduction in image quality or luminance non-uniformity caused by a region-based non-uniformity (or deviation) of the pixel common voltage applied to each pixel P.

Each of the plurality of inner isolation portions 103 may be disposed adjacent to or near each of the plurality of common electrode connection portions CECP to surround each of the plurality of common electrode connection portions CECP. One inner isolation portions 103 may be disposed adjacent to or near the common electrode connection portion CECP to surround one common electrode connection portion CECP.

Each of the plurality of inner isolation portions 103 may be disposed to surround each of the plurality of secondary line connection portions SLCP. For example, each of the plurality of inner isolation portions 103 may be disposed to surround all of one common electrode connection portion CECP and one secondary line connection portion SLCP.

Each of the plurality of inner isolation portions 103 according to an embodiment of the present disclosure may include first to $n^{th}$ trench structures 103-1 to 103-2.

Each of the first to $n^{th}$ trench structures according to an embodiment may have an arc shape which includes an opening portion at one side thereof. Each of the first to $n^{th}$ trench structures may have an arc shape which is disposed in a concentric circle shape and is opened at one side thereof. The isolation structures can be nested, one inside the other, with the openings of each on opposite sides from each other. For example, the first to $n^{th}$ trench structures may have a C-shape, but embodiments of the present disclosure are not limited thereto. The structures could be boxes, interdigitated combs or other shapes besides C-shaped, for example. According to an embodiment, an opening portion of a $k^{th}$ (where k is 1 to n−1) trench structure of the first to $n^{th}$ trench structures may be surrounded by a $k+1^{th}$ trench structure.

Each of the plurality of inner device isolation portions 103 according to an embodiment may include a first trench structure 103-1 and a second trench structure 103-2. The trench structures can be, in one embodiment, vertical structures or a mesa formed within a trench.

The first trench structure 103-1 may be disposed to surround a portion adjacent to or near one common electrode connection portion CECP and one secondary line connection portion SLCP. An opening portion of the first trench structure 103-1 may be adjacent to the common electrode connection portion CECP. Accordingly, the secondary line connection portion SLCP may be surrounded by the first trench structure 103-1. For example, the common electrode connection portion CECP and the secondary line connection portion SLCP may be disposed in an inner region of the first trench structure 103-1.

The second trench structure 103-2 may be disposed to surround the first trench structure 103-1. The second trench structure 103-2 may surround an opening portion of the first trench structure 103-1. An opening portion of the second trench structure 103-2 may be toward a direction opposite to a direction facing the opening portion of the first trench structure 103-1, so that it faces a closed portion of the arc of 103-1.

Each of the first trench structure 103-1 and the second trench structure 103-2 according to an embodiment may include a first trench pattern (or a first trench pattern structure) 103a, a second trench pattern (or a second trench pattern structure) 103b, and a third trench pattern (or a third trench pattern structure) 103c. The reference herein to a pattern includes within the meaning a structure that is formed in that pattern or that comprises the pattern that has been formed.

The first trench pattern 103a may be disposed over the passivation layer 101d of a pixel trench area defined partially surrounding, adjacent to or near one common electrode connection portion CECP and one secondary line connection portion SLCP. The first trench pattern 103a may have an arc shape where one side thereof is opened in a concentric circle shape. For example, the first trench pattern 103a may have a C-shape, but embodiments of the present disclosure are not limited thereto.

The first trench pattern 103a may include the same material as the planarization layer 102. For example, the first trench pattern 103a may be formed or implemented by a portion (or a non-patterning region) of the planarization layer 102 which remains without being patterned (or removed) by a patterning process performed on the planarization layer 102 disposed over the passivation layer 101d of the pixel trench area. Accordingly, the first trench pattern 103*a* may have the same thickness (or thickness or height) as the planarization layer 102.

The first trench pattern 103*a* according to an embodiment may be implemented in an inclined vertical structure or a forward tapered structure. For example, in the first trench pattern 103*a*, a width of a bottom surface may be wider than a top surface, and thus, a lateral surface may be implemented in an inclined structure or a forward tapered structure. For example, the first trench pattern 103*a* taken along a first direction X may have a cross-sectional structure having a trapezoid shape where a top side is narrower than a lower side.

The second trench pattern 103*b* may be disposed over the first trench pattern 103*a*.

The second trench pattern 103*b* according to an embodiment may be formed along with the pixel electrode PE disposed in a pixel. For example, the second trench pattern 103*b* may be formed along with the second electrode connection pattern ECP2 and be a vertical isolation member.

The second trench pattern 103*b* according to an embodiment may have a width which is wider than a top surface of the first trench pattern 103*a*. The second trench pattern 103*b* may have a width which is wider than or equal to a lower surface of the first trench pattern 103*a*. Therefore, the second trench pattern 103*b* may include a disconnection tip 103*t* which protrudes to the outside of a lateral surface of the first trench pattern 103*a*. For example, both periphery portions of the second trench pattern 103*b* may protrude to cover or occlude the lateral surface of the first trench pattern 103*a*, and thus, the disconnection tip 103*t* may be implemented. For example, a distance between an end of the disconnection tip 103*t* of the second trench pattern 103*b* and the lateral surface of the first trench pattern 103*a* may be greater than a thickness obtained by summating a thickness of the self-emitting device ED and a thickness of the common electrode CE. For example, the disconnection tip 103*t* of the second trench pattern 103*b* may be formed or implemented by an over-etching process which uses the disconnection tip 103*t* of the second trench pattern 103*b* as a mask and is performed on the planarization layer 102. For example, the disconnection tip 103*t* of the second trench pattern 103*b* may be referred to as a second protrusion portion. For example, the second trench pattern 103*b* may be referred to as an eaves structure or a tip structure material.

According to an embodiment of the present disclosure, the lateral surface of the first trench pattern 103*a* may have an undercut structure with respect to the second trench pattern 103*b*. For example, each of the first trench structure 103-1 and the second trench structure 103-2 may include a boundary portion between the first trench pattern 103*a* and the second trench pattern 103*b* or an undercut area disposed at an upper lateral surface of the first trench pattern 103*a*. The undercut area between the first trench pattern 103*a* and the second trench pattern 103*b* may be a structure material for isolating (or disconnecting) at least a portion of the light emitting device layer EDL. For example, the undercut area between the first trench pattern 103*a* and the second trench pattern 103*b* may be formed or implemented by an over-etching process performed on the planarization layer 102. The second trench pattern 103*b* may protrude to the outside of the lateral surface of the first trench pattern 103*a* based on an undercut structure of the first trench pattern 103*a*, and thus, may cover the lateral surface of the first trench pattern 103*a*. Accordingly, the second trench pattern 103*b* may have an eaves structure with respect to the first trench pattern 103*a*.

The third trench pattern 103*c* may be stacked on the second trench pattern 103*b*. The third trench pattern 103*c* may have a width which is less than or equal to a top surface of the second trench pattern 103*b*. A lateral surface of the third trench pattern 103*c* may be implemented in an inclined structure or a forward tapered structure. For example, the first trench pattern 103*a* taken along a widthwise direction may have a cross-sectional structure having a trapezoid shape which is the same as the second trench pattern 103*b*.

The third trench pattern 103*c* according to an embodiment may be stacked on the second trench pattern 103*b* and may include the same material as a bank BK. The third trench pattern 103*c* may be formed or implemented as vertical member that is constructed from a portion (or a non-patterning region) of the bank BK which remains without being patterned (or removed) by a patterning process performed on the bank BK. The third trench pattern 103*c* may prevent the second trench pattern 103*b* from being etched.

According to an embodiment, a material layer of the self-emitting device ED disposed on the inner isolation portion 103 may be automatically isolated (or disconnected) in performing a deposition process, based on the undercut area (or an eaves structure) between the first trench pattern 103*a* and the second trench pattern 103*b*. For example, because the deposition material of the self-emitting device ED has linearity, the material layer of the self-emitting device ED may not be deposited over the lateral surface of the first trench pattern 103*a* covered by the second trench pattern 103*b* and may be deposited on a top surface and a lateral surface of the third trench pattern 103*c*, a lateral surface of the second trench pattern 103*b*, and the passivation layer 101*d* near the first trench pattern 103*a*, and thus, may be isolated (or disconnected) in the undercut area between the first trench pattern 103*a* and the second trench pattern 103*b*. Accordingly, the self-emitting device ED may be automatically isolated (or disconnected) in each of the first trench pattern 103*a* and the second trench pattern 103*b* in performing a deposition process.

Accordingly, the trench pattern 103-1 forms a first isolation structure surrounding the electrode connection patterns, the first isolation structure being located between the two adjacent columns of pixels and the two adjacent rows of pixels. The first isolation structure 103-1 includes a first vertical member 103*a* and a second vertical member 103*b* over the first vertical member 103*a*. There is a third vertical member 103*c* over the second vertical 103*b*, each of the vertical members 103*a*, 103*b* and 103*c* comprising the first isolation structure 103-1. The first vertical member 103*a* has a first width at a top region and the second vertical member 103*b* has a second width at its bottom region that is greater than the first width.

According to an embodiment, an electrode material of the common electrode CE disposed over the inner isolation portion 103 may be automatically isolated (or disconnected) in performing a deposition process, based on the undercut area (or the eaves structure) between the first trench pattern 103*a* and the second trench pattern 103*b*. For example, the electrode material of the common electrode CE may not be deposited on the lateral surface of the first trench pattern 103*a* covered by the second trench pattern 103*b* and may be deposited on the top surface and the lateral surface of the third trench pattern 103*c*, the lateral surface of the second trench pattern 103*b*, and the passivation layer 101*d* near the first trench pattern 103*a*, and thus, may be isolated (or disconnected) in the undercut area between the first trench pattern 103*a* and the second trench pattern 103*b*. Accordingly, the common electrode CE disposed on the inner isolation portion 103 may be automatically isolated (or disconnected) in each of the first trench structure 103-1 and the second trench structure 103-2 in performing a deposition process.

The common electrode CE isolated by the inner isolation portion 103 may directly contact an uppermost surface (or a surface) of the passivation layer 101d to surround an end of the self-emitting device ED isolated by the inner isolation portion 103. For example, the common electrode CE isolated by the inner isolation portion 103 may seal a boundary portion between the passivation layer 101d and the end of the self-emitting device ED isolated by the inner isolation portion 103, and thus, may prevent the penetration of water through the boundary portion between the passivation layer 101d and the end of the self-emitting device ED.

According to another embodiment, the electrode material of the common electrode CE disposed over the inner isolation portion 103 may be formed to be continued without being isolated or disconnected at an undercut area of the inner isolation portion 103, and thus, may be formed to wholly surround the self-emitting device ED. For example, the common electrode CE may be inserted into the undercut area between the first trench pattern 103a and the second trench pattern 103b and may cover the lateral surface of the first trench pattern 103a, an uppermost surface (or a surface) of the passivation layer 101d exposed under the disconnection tip 103t of the second trench pattern 103b, and the self-emitting device ED isolated by the inner isolation portion 103. Accordingly, the common electrode CE may wholly surround the self-emitting device ED isolated by the inner isolation portion 103.

Each of the plurality of inner isolation portions 103 may be surrounded and planarized by the encapsulation layer 106. For example, the first encapsulation layer 106a of the encapsulation layer 106 may be disposed over the common electrode CE to surround or cover the common electrode CE. The second encapsulation layer 106b of the encapsulation layer 106 may be disposed over the first encapsulation layer 106a and may provide a flat surface over the first encapsulation layer 106a. Accordingly, the plurality of inner isolation portions 103 and a peripheral region thereof may be planarized by the second encapsulation layer 106b. The second encapsulation layer 106b may be covered by the third encapsulation layer 106c of the encapsulation layer 106.

Each of the plurality of inner isolation portions 103 according to an embodiment may further include a maze area 103m disposed between the first to $n^{th}$ trench structures 103-1 to 103-2. For example, each of the plurality of inner isolation portions 103 may further include a maze area 103m disposed between the first and second trench structures 103-1 and 103-2.

The maze area 103m may be an area between the common electrode CE disposed in an outer region of the inner isolation portion 103 and a line contact region CEc of the common electrode CE disposed in an inner region of the inner isolation portion 103.

The maze area will include one or more structures that have members that have a number of turns or corners between an outermost region and an inner most region. Thus, water or other impurities must navigate from the outer part of the maze towards the center in order to reach the central region. The maze area 103m contains one or more maze walls or structures, having both horizontal and vertical structures and horizontal and vertical turns and corners. By having horizontal and vertical structures, turns and corners, it is much more difficult for water or other impurities to reach the inner most region of the maze area.

The maze area 103m according to an embodiment may have an arc shape between the first trench structure 103-1 and the second trench structure 103-2. For example, the maze area 103m may prevent the line contact region CEc of the common electrode CE, overlapping each of the common electrode connection portion CECP and the secondary line connection portion SLCP, from being isolated in an island shape by each of the first trench structure 103-1 and the second trench structure 103-2 having an arc shape. Accordingly, the maze area 103m may be referred to as having a common electrode area, a common electrode bridge area, or a common electrode bridge line.

According to an embodiment, the maze area 103m may be a partial region of the common electrode CE which is not removed, between the first trench structure 103-1 and the second trench structure 103-2, so that the line contact region CEc of the common electrode CE overlapping each of the common electrode connection portion CECP and the secondary line connection portion SLCP is not isolated in an island shape from the common electrode CE disposed in an outer region of the inner isolation portion 103. Therefore, the line contact region CEc of the common electrode CE overlapping each of the common electrode connection portion CECP and the secondary line connection portion SLCP may be continued without being disconnected from the common electrode CE disposed in the outer region of the inner isolation portion 103, through the maze area 103m. Accordingly, the pixel common voltage supplied to the pixel common voltage line CVL may be supplied to the common electrode CE disposed in the outer region of the inner isolation portion 103 through the first electrode connection pattern ECP1, the second electrode connection pattern ECP2, the line contact region CEc of the common electrode CE, and the maze area 103m.

According to an embodiment, each of the plurality of inner isolation portions 103 may block or maximally delay (or extend) the inner penetration of water (or moisture) through the common electrode connection portion CECP and/or the secondary line connection portion SLCP, thereby preventing or minimizing a reduction in reliability of the self-emitting device ED caused by the inner penetration of water (or moisture). For example, water penetrating into the light emitting device layer EDL over each of the common electrode connection portion CECP and/or the secondary line connection portion SLCP may travel (or penetrate) toward the emission area EA through a shortest water penetration path MPP1. In this case, because the self-emitting device ED disposed in the shortest water penetration path MPP1 is isolated by each of the first trench structure 103-1 and the second trench structure 103-2, water traveling toward the emission area EA through the shortest water penetration path MPP1 may be blocked by each of the first trench structure 103-1 and the second trench structure 103-2. Water penetrating into the light emitting device layer EDL over each of the common electrode connection portion CECP and/or the secondary line connection portion SLCP may travel (or penetrate) toward the emission area EA through a water penetration delay path MPP2 including the maze area 103m bypassing the shortest water penetration path MPP1, and thus, a water penetration time and a water penetration path reaching the emission area EA may be delayed or extend by a length of the water penetration delay path MPP2.

Therefore, each of the plurality of inner isolation portions 103 may maximally extend a water penetration time and a water penetration path where water penetrating into the light emitting device layer EDL over each of the common electrode connection portion CECP and/or the secondary line connection portion SLCP reaches the emission area EA, and thus, a reduction in reliability of a self-emitting device caused by water may be minimized or a lifetime of the self-emitting device may extend.

As described above, in the light emitting display apparatus according to an embodiment of the present disclosure, water penetration occurring in the common electrode connection portion CECP may be prevented or delayed through the inner isolation portion 103 disposed adjacent to or near the common electrode connection portion CECP electrically connected to the common electrode CE and the pixel common voltage line CVL disposed in the display area AA. Also, in the light emitting display apparatus according to an embodiment of the present disclosure, the dam 104 and the outer isolation portion 105 may be disposed at a periphery portion of the first substrate 100 (or an outermost pixel), thereby preventing a reduction in reliability of the self-emitting device ED caused by the lateral penetration of water and implementing an air bezel structure having no bezel area and having a zero bezel.

Figure 14:
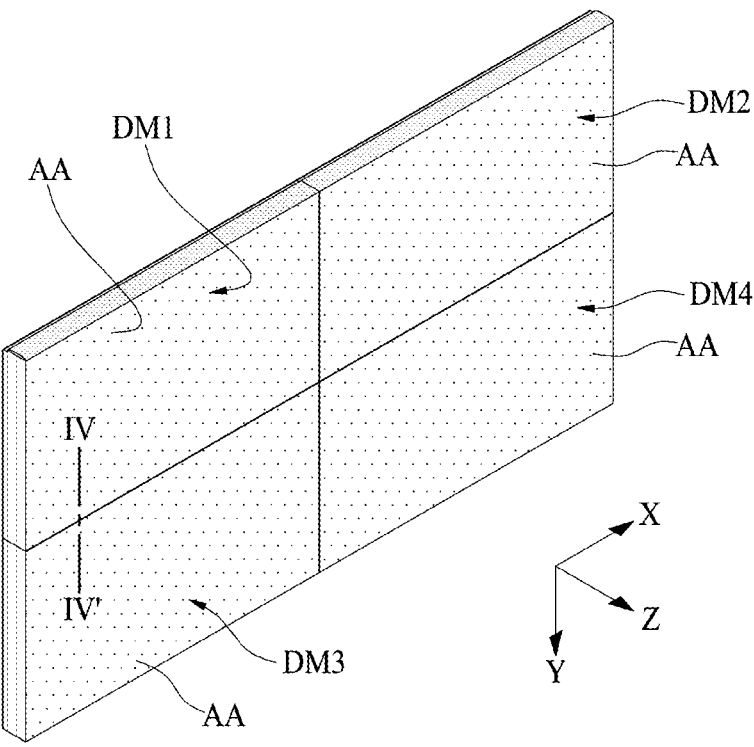
FIG. 14 is a diagram illustrating a multi-screen display apparatus according to an embodiment of the present disclosure.
Figure 15:
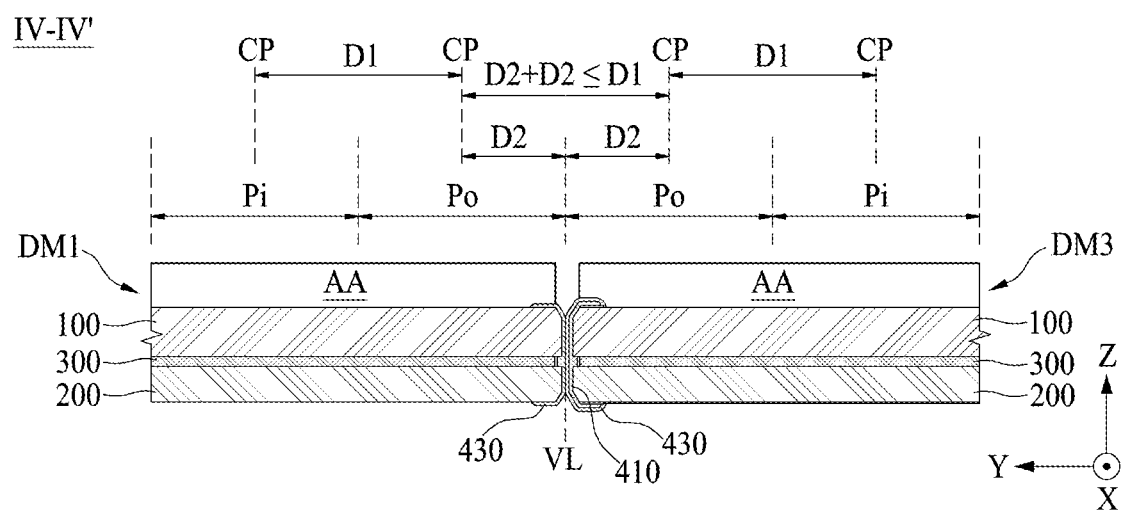
FIG. 15 is a cross-sectional view taken along line IV-IV' illustrated in FIG. 14.

FIG. 14 is a diagram illustrating a multi-screen display apparatus according to an embodiment of the present disclosure, and FIG. 15 is a cross-sectional view taken along line IV-IV' illustrated in FIG. 14. FIGS. 14 and 15 illustrate a multi-screen display apparatus implemented by tiling the light emitting display apparatus according to another embodiment of the present disclosure illustrated in FIGS. 1 to 13.

Referring to FIGS. 14 and 15, the multi-screen display apparatus (or a tiling light emitting display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the light emitting display apparatus according to an embodiment of the present disclosure illustrated in FIGS. 1 to 13, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to the present embodiment, in each of the plurality of display devices DM1 to DM4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 15, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed in each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed in each of the display devices DM1 to DM4, and thus, there may be no seam or boundary portion between two adjacent display devices DM1 to DM4, whereby there may be no dark area caused by a boundary portion provided between the display devices DM1 to DM4. As a result, the image displayed on the multi-screen display apparatus in which the plurality of display devices DM1, DM2, DM3, and DM4 are tiled in an N×M form may be displayed continuously without a sense of disconnection (or discontinuity) at boundary portion between the plurality of display devices DM1, DM2, DM3, and DM4.

In FIGS. 14 and 15, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, in the x×1 form, x may be a natural number greater than or equal to 2, in the 1×y form, y may be a natural number greater than or equal to 2, and in the x×y form, x and y may be natural numbers greater than or equal to 2 and may be equal to or different from each other. For example, in the x×y form, x may be a natural number greater than or equal to 2 and may be equal to y, or x and y may be natural numbers greater than or equal to 2 with y greater or less than x.

As described above, when display area AA of the plurality of display devices DM1 to DM4 are one screen and displays one image, a multi-screen display apparatus according to an embodiment of the present disclosure may display an image which is not disconnected and is continuous at a boundary portion between the plurality of display devices DM1 to DM4, and thus, the immersion of a viewer watching an image displayed by the multi-screen display apparatus may be enhanced.

A light emitting display apparatus and multi-screen display apparatus including the same according to an embodiment of the present disclosure will be described below.

A light emitting display apparatus according to an embodiment of the present disclosure may comprise a plurality of pixels arranged along a first direction and a second direction different from the first direction over a first substrate, a circuit layer including a pixel common voltage line in parallel with the second direction and disposed between the plurality of pixels along the first direction, a light emitting device layer including a self-emitting device disposed over the circuit layer and a common electrode disposed over the self-emitting device, a common electrode connection portion electrically coupling the pixel common voltage line to the common electrode, and an inner isolation portion surrounding the common electrode connection portion and isolating the self-emitting device near each of the plurality of common electrode connection portion.

According to some embodiments of the present disclosure, the inner isolation portion may comprise first to $n^{th}$ (where n is a natural number of 2 or more) trench structures surrounding the common electrode connection portion.

According to some embodiments of the present disclosure, the inner isolation portion may comprise first to $n^{th}$ (where n is a natural number of 2 or more) trench structures surrounding the common electrode connection portion, and each of the first to $n^{th}$ trench structures may comprise an arc shape which is disposed in a concentric circle shape and includes an opening portion at one side thereof.

According to some embodiments of the present disclosure, the inner isolation portion may further comprise a maze area formed between the first to $n^{th}$ trench structures.

According to some embodiments of the present disclosure, the common electrode disposed in an inner region of the inner isolation portion may be electrically connected to the common electrode disposed in an outer region of the inner isolation portion by the common electrode disposed in the maze area.

According to some embodiments of the present disclosure, an opening portion of a $k^{th}$ (where k is 1 to n−1) trench structure of the first to $n^{th}$ trench structures may be surrounded by a $k+1^{th}$ trench structure.

According to some embodiments of the present disclosure, an opening portion of a $k^{th}$ (where k is 1 to n−1) trench structure of the first to $n^{th}$ trench structures and an opening portion of a $k+1^{th}$ trench structure may be toward different directions.

According to some embodiments of the present disclosure, each of the first to $n^{th}$ trench structures may comprise a first trench pattern disposed over the circuit layer, a second trench pattern disposed over the first trench pattern to have an eaves structure with respect to the first trench pattern, and a third trench pattern disposed over the second trench pattern, and the self-emitting device disposed over the inner isolation portion may be isolated by the eaves structure of the second trench pattern. The eaves therefore act as both a vertical and horizontal maze structure. The turn around the eave is both vertically upward and also outward, in a horizontal direction.

According to some embodiments of the present disclosure, the light emitting display apparatus may further comprise a planarization layer disposed between the circuit layer and the light emitting device layer, the light emitting device layer may further comprise a pixel electrode disposed over the planarization layer of each of the plurality of pixels, the first trench pattern may comprise the same material as a material of the planarization layer, and the second trench pattern may comprise the same material as a material of the pixel electrode.

According to some embodiments of the present disclosure, the light emitting display apparatus may further comprise a bank disposed over the planarization layer and a periphery portion of the pixel electrode disposed at each of the plurality of pixels, the third trench pattern may comprise the same material as a material of the bank.

According to some embodiments of the present disclosure, the circuit layer further may comprise an interlayer insulation layer and a passivation layer disposed over the pixel common voltage line, the common electrode connection portions may comprise a first electrode connection pattern disposed between the interlayer insulation layer and the passivation layer and electrically connected to the pixel common voltage line, a second electrode connection pattern disposed over the passivation layer and electrically connected to the first electrode connection pattern, and a connection trench including an undercut area formed by removing the passivation layer between an end portion of the second electrode connection pattern and the first electrode connection pattern, and the common electrode may be electrically connected to a lateral surface and a bottom surface of the end portion of the second electrode connection pattern.

According to some embodiments of the present disclosure, the end portion of the second electrode connection pattern may have an eaves structure with respect to the connection trench, and the common electrode may be electrically connected to the first electrode connection pattern at the undercut area or under the eaves structure.

According to some embodiments of the present disclosure, the light emitting display apparatus may further comprise a planarization layer disposed between the circuit layer and the light emitting device layer, the light emitting device layer may further comprise a pixel electrode disposed over the planarization layer, the common voltage connection portion may further comprise a groove formed by removing a portion of the planarization layer to expose the passivation layer, and the second electrode connection pattern may be disposed over the planarization layer and comprises the same material as a material of the pixel electrode.

According to some embodiments of the present disclosure, the light emitting display apparatus may further comprise a secondary voltage line disposed in the circuit layer in parallel with the pixel common voltage line, a line connection pattern to electrically connect the pixel common voltage line and the secondary voltage line, and a secondary line connection portion to electrically connect the secondary voltage line to the common electrode, the inner isolation portion may additionally surround the secondary line connection portion and may additionally isolate the self-emitting device adjacent to or near the secondary line connection portion.

According to some embodiments of the present disclosure, the inner isolation portion may comprise first to $n^{th}$ (where n is a natural number of 2 or more) trench structures surrounding each of the plurality of common electrode connection portions and each of the plurality of secondary line connection portions, and a maze area between the first to $n^{th}$ trench structures, and one common electrode connection portion and one secondary line connection portion may be surrounded by the first to $n^{th}$ trench structures.

According to some embodiments of the present disclosure, each of the first to $n^{th}$ trench structures may comprise an arc shape which is disposed in a concentric circle shape and includes an opening portion at one side thereof.

According to some embodiments of the present disclosure, each of the first to $n^{th}$ trench structures may comprise a first trench pattern disposed over the circuit layer, a second trench pattern disposed over the first trench pattern to have an eaves structure with respect to the first trench pattern, and a third trench pattern disposed over the second trench pattern, and the self-emitting device disposed over the inner isolation portion may be isolated by the eaves structure of the second trench pattern.

According to some embodiments of the present disclosure, the light emitting display apparatus may further comprise a dam disposed at a periphery portion of the first substrate, an outer isolation portion disposed adjacent to or near the dam to isolate the self-emitting device disposed over the outer isolation portion, and an encapsulation layer disposed over the light emitting device layer and including an organic encapsulation layer disposed over an encapsulation area surrounded by the dam.

According to some embodiments of the present disclosure, the outer isolation portion may comprise a plurality of isolation structures, each of the plurality of isolation structures may comprise a lower structure disposed in the circuit layer, an eaves structure disposed over the lower structure, and an upper structure disposed over the eaves structure, and wherein the self-emitting device disposed over the outer isolation portion is isolated by the eaves structure.

According to some embodiments of the present disclosure, the light emitting display apparatus may further comprise a first pad part configured to include a plurality of first pads disposed at one periphery portion of the first substrate, a second substrate configured to include a second pad part including a plurality of second pads overlapping each of the plurality of first pads, a coupling member disposed between the first substrate and the second substrate, and a routing portion disposed at one lateral surface of each of the first substrate and the second substrate and including a plurality of routing lines to connect the plurality of first pads to the plurality of second pads in a one-to-one relationship.

A multi-screen display apparatus according to some embodiments of the present disclosure may comprise a plurality of display devices disposed along at least one direction of a first direction and a second direction different from the first direction, each of the plurality of display devices may comprise a light emitting display apparatus, and the light emitting display apparatus may comprise a plurality of pixels arranged along the first direction and the second direction over a first substrate, a circuit layer including a pixel common voltage line in parallel with the second direction and disposed between the plurality of pixels along the first direction, a light emitting device layer including a self-emitting device disposed over the circuit layer and a common electrode disposed over the self-emitting device, a common electrode connection portion electrically coupling the pixel common voltage line to the common electrode, and an inner isolation portion surrounding the common electrode connection portion and isolating the self-emitting device disposed over the common electrode connection portion.

According to some embodiments of the present disclosure, in a first display device and a second display device adjacent along the first direction or/and the second direction, a distance between a center portion of an outermost pixel of the first display device and a center portion of an outermost pixel of the second display device may be less than or equal to a pixel pitch, and the pixel pitch may be a distance between center portions of pixels adjacent along the first direction and the second direction.

A display apparatus according to some embodiments of the present disclosure may comprise a substrate having a plurality of pixels formed thereon, the pixels being arranged in adjacent rows and adjacent columns; a plurality of pixel driving voltage lines positioned between two adjacent columns of pixels; a plurality of electrode connection patterns coupled to the respective pixel driving voltage lines at a location between two adjacent columns of pixels and two adjacent rows of pixels; and a first isolation structure surrounding the electrode connection patterns, the first isolation member being located between the two adjacent columns of pixels and the two adjacent rows of pixels, the first isolation structure may include a first vertical member and a second vertical member over the first vertical member.

According to some embodiments of the present disclosure, the first vertical member at a top region may have a first width and the second vertical member at a bottom region may have a second width that is greater than the first width.

According to some embodiments of the present disclosure, the display apparatus may further include an eave structure positioned between the first vertical member and the second vertical member.

According to some embodiments of the present disclosure, the display apparatus may further include a second isolation structure surrounding the first isolation structure, the second isolation member being a circular member having an opening located adjacent to a wall portion of the first isolation structure.

According to some embodiments of the present disclosure, the first isolation structure may include an opening positioned opposite the opening of the second isolation structure.

The light emitting display apparatus according to an embodiment of the present disclosure may be applied to all electronic devices including a display panel. For example, the display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A light emitting display apparatus comprising:
a plurality of pixels arranged along a first direction and a second direction different from the first direction over a first substrate;

a circuit layer including a pixel common voltage line in parallel with the second direction and disposed between the plurality of pixels along the first direction;

a light emitting device layer including a self-emitting device disposed over the circuit layer and a common electrode disposed over the self-emitting device;

a common electrode connection portion electrically coupling the pixel common voltage line to the common electrode; and an inner isolation member surrounding the common electrode connection portion and isolating the self-emitting device adjacent to the common electrode connection portion, wherein the circuit layer further includes an interlayer insulation layer disposed over the pixel common voltage line and a passivation layer disposed over the interlayer insulation layer, wherein the common electrode connection portion comprises:

a first electrode connection pattern disposed between the interlayer insulation layer and the passivation layer and electrically connected to the pixel common voltage line;

a second electrode connection pattern disposed over the passivation layer and electrically connected to the first electrode connection pattern; and a connection trench including an undercut area formed by removing the passivation layer between an end portion of the second electrode connection pattern and the first electrode connection pattern, and wherein the common electrode is electrically connected to a lateral surface and a bottom surface of the end portion of the second electrode connection pattern.

2. The light emitting display apparatus of claim 1, wherein the inner isolation member comprises first to $n^{th}$ (where n is a natural number of 2 or more) trench structures surrounding the common electrode connection portion, and wherein each of the first to $n^{th}$ trench structures includes an opening portion at one side thereof.

3. The light emitting display apparatus of claim 2, wherein the inner isolation member further comprises a maze area formed between the first to $n^{th}$ trench structures.

4. The light emitting display apparatus of claim 3, wherein the common electrode disposed in an inner region of the inner isolation member is electrically connected to the common electrode disposed in an outer region of the inner isolation member by the common electrode disposed in the maze area.

5. The light emitting display apparatus of claim 2, wherein the opening portion of a $k^{th}$ (where k is 1 to n−1) trench structure of the first to $n^{th}$ trench structures is surrounded by a k+1th trench structure, or wherein the opening portion of a $k^{th}$ trench structure of the first to $n^{th}$ trench structures and the opening portion of a k+1th trench structure are toward different directions.

6. The light emitting display apparatus of claim 2, wherein each of the first to $n^{th}$ trench structures comprises:

a first trench pattern disposed over the circuit layer;

a second trench pattern disposed over the first trench pattern to have an eaves structure with respect to the first trench pattern; and a third trench pattern disposed over the second trench pattern, and wherein the self-emitting device disposed over the inner isolation member is isolated by the eaves structure of the second trench pattern.

7. The light emitting display apparatus of claim 6, further comprising a planarization layer disposed between the circuit layer and the light emitting device layer, wherein the light emitting device layer further comprises a pixel electrode disposed over the planarization layer, wherein the first trench pattern comprises the same material as a material of the planarization layer, and wherein the second trench pattern comprises the same material as a material of the pixel electrode.

8. The light emitting display apparatus of claim 7, further comprising a bank disposed over the planarization layer and a periphery portion of the pixel electrode, wherein the third trench pattern comprises the same material as a material of the bank.

9. The light emitting display apparatus of claim 1, wherein the end portion of the second electrode connection pattern has an eaves structure with respect to the connection trench, and wherein the common electrode is electrically connected to the first electrode connection pattern under the eaves structure.

10. The light emitting display apparatus of claim 1, further comprising a planarization layer disposed between the circuit layer and the light emitting device layer, wherein the light emitting device layer further comprises a pixel electrode disposed over the planarization layer, wherein the common electrode connection portion further comprises a groove formed by removing a portion of the planarization layer to expose the passivation layer, and wherein the second electrode connection pattern is disposed over the exposed passivation layer and the planarization layer and comprises the same material as a material of the pixel electrode.

11. The light emitting display apparatus of claim 1, further comprising:

a secondary voltage line disposed in the circuit layer in parallel with the pixel common voltage line;

a line connection pattern to electrically connect the pixel common voltage line and the secondary voltage line; and a secondary line connection portion to electrically connect the secondary voltage line to the common electrode, wherein the inner isolation member additionally surrounds the secondary line connection portion.

12. The light emitting display apparatus of claim 1, further comprising:

a dam disposed at a periphery portion of the first substrate;

an outer isolation portion disposed adjacent to the dam to isolate the self-emitting device disposed over the outer isolation portion; and an encapsulation layer disposed over the light emitting device layer and including an organic encapsulation layer disposed over an encapsulation area surrounded by the dam.

13. The light emitting display apparatus of claim 12, wherein the outer isolation portion comprises a plurality of isolation structures, wherein each of the plurality of isolation structures comprise:

a lower structure disposed in the circuit layer;

an eaves structure disposed over the lower structure; and an upper structure disposed over the eaves structure, and wherein the self-emitting device disposed over the outer isolation portion is isolated by the eaves structure.

14. The light emitting display apparatus of claim 1, further comprising:
a first pad part configured to include a plurality of first pads disposed at one periphery portion of the first substrate;
a second substrate configured to include a second pad part including a plurality of second pads overlapping the plurality of first pads;
a coupling member disposed between the first substrate and the second substrate; and a routing portion disposed at one lateral surface of each of the first substrate and the second substrate and a plurality of routing lines coupled respectively to the plurality of first pads.

15. A display apparatus comprising:
a substrate having a plurality of pixels formed thereon, the pixels being arranged in adjacent rows and adjacent columns;
a plurality of pixel driving voltage lines positioned between two adjacent columns of pixels;
a plurality of electrode connection patterns coupled to the respective pixel driving voltage lines at a location between two adjacent columns of pixels and two adjacent rows of pixels;
a first isolation structure surrounding the electrode connection patterns, the first isolation structure being located between the two adjacent columns of pixels and the two adjacent rows of pixels, wherein the first isolation structure includes a first vertical member and a second vertical member over the first vertical member, the first isolation structure including a first opening; and
a second isolation structure having a second opening, the second isolation structure partially surrounding the first isolation structure except for the second opening, the second opening facing a different direction from that of the first opening.

16. The display apparatus of claim 15, further including:
an eave structure positioned between the first vertical member and the second vertical member.

17. The display apparatus of claim 16, wherein the second isolation structure is a circular member and the second opening is located adjacent to a wall portion of the first isolation structure.

18. The display apparatus of claim 17, wherein the first isolation structure includes an opening positioned opposite the opening of the second isolation structure.

19. A multi-screen display apparatus comprising:
a first display device and a second display device abutting each other,
wherein each of the first display device and the second display device comprises the display apparatus of claim 15.

20. The multi-screen display apparatus of claim 19,
wherein a distance between a center portion of an outermost pixel of the first display device and a center portion of an outermost pixel of the second display device is less than or equal to a pixel pitch, and
wherein the pixel pitch is a distance between center portions of two adjacent pixels in the first display device or the second display device.

21. A light emitting display apparatus comprising:
a plurality of pixels arranged along a first direction and a second direction different from the first direction over a first substrate;
a circuit layer including a pixel common voltage line in parallel with the second direction and disposed between the plurality of pixels along the first direction;
a light emitting device layer including a self-emitting device disposed over the circuit layer and a common electrode disposed over the self-emitting device;
a planarization layer disposed between the circuit layer and the light emitting device layer;
a common electrode connection portion electrically coupling the pixel common voltage line to the common electrode; and
an inner isolation member surrounding the common electrode connection portion and isolating the self-emitting device adjacent to the common electrode connection portion,
wherein the inner isolation member includes a first trench pattern disposed over the circuit layer and a second trench pattern disposed over the first trench pattern to have an eaves structure with respect to the first trench pattern,
wherein the light emitting device layer further includes a pixel electrode disposed over the planarization layer,
wherein the first trench pattern includes a same material as a material of the planarization layer, and
wherein the second trench pattern includes a same material as a material of the pixel electrode.

* * * * *